United States Patent
Hayashi et al.

(10) Patent No.: US 7,399,574 B2
(45) Date of Patent: Jul. 15, 2008

(54) CURABLE RESIN FOR PHOTO-PATTERNING, PROCESS FOR PRODUCING THE SAME, CURABLE RESIN COMPOSITION, COLOR FILTER, LIQUID CRYSTAL PANEL SUBSTRATE, AND LIQUID CRYSTAL PANEL

(75) Inventors: Shinji Hayashi, Tokyo (JP); Shunsuke Sega, Tokyo (JP); Hiromu Taguchi, Nagoya (JP); Mitsutaka Hasegawa, Nagoya (JP); Eiichi Okazaki, Nagoya (JP); Keiji Maeda, Nagoya (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 700 days.

(21) Appl. No.: 10/255,353

(22) Filed: Sep. 26, 2002

(65) Prior Publication Data
US 2003/0118922 A1  Jun. 26, 2003

(30) Foreign Application Priority Data
Sep. 28, 2001 (JP) ............................. 2001-304411
Apr. 10, 2002 (JP) ............................. 2002-108254
Jun. 21, 2002 (JP) ............................. 2002-181719

(51) Int. Cl.
*G03C 1/73* (2006.01)
*G03F 7/027* (2006.01)

(52) U.S. Cl. .................... 430/287.1; 428/1.3; 428/1.5; 430/286.1

(58) Field of Classification Search ................ 428/1.31, 428/1.3, 1.5, 1.54–1.55; 430/281.1, 283.1, 430/445, 905, 913, 918, 920, 286.1, 287.1; 522/134–144
See application file for complete search history.

(56) References Cited

U.S. PATENT DOCUMENTS

| | | | | |
|---|---|---|---|---|
| 4,845,009 A | * | 7/1989 | Kita et al. | 430/176 |
| 4,968,581 A | * | 11/1990 | Wu et al. | 430/192 |
| 5,098,982 A | * | 3/1992 | Long, II | 521/56 |

(Continued)

FOREIGN PATENT DOCUMENTS

JP          05-281734          10/1993

(Continued)

OTHER PUBLICATIONS

Hiroyuki Kamiya et al; 5 6.3:Development of One Drop Fill Technology for AM-LCDs; SID 01 Digest, 2001.

*Primary Examiner*—Terrel Morris
*Assistant Examiner*—Sophie Hon
(74) *Attorney, Agent, or Firm*—Ladas & Parry LLP

(57) ABSTRACT

Provided are a curable resin and a curable resin composition which have alkali-solubility and curability that can freely be adjusted and a high sensitivity, a liquid crystal panel substrate which can maintain an even cell gap, and a liquid crystal panel using the liquid crystal panel substrate to exhibit a superior display quality. A curable resin composition comprising an imide-containing copolymer having a molecular structure wherein a constitutional unit at least the following units are connected: a constitutional unit having a cyclic imide group represented by the formula (1), a constitutional unit having an acid functional group such as a carboxyl group; and a constitutional unit having a photopolymerizing functional group. In a liquid crystal panel substrate (color filter 103), plural spacers (column-shaped spacers 12) are disposed in a non-display region on a substrate 5.

22 Claims, 4 Drawing Sheets

U.S. PATENT DOCUMENTS

| | | | |
|---|---|---|---|
| 6,030,748 A * | 2/2000 | Nishimiya et al. | 430/271.1 |
| 6,255,034 B1 * | 7/2001 | Shimada et al. | 430/281.1 |
| 6,465,540 B1 * | 10/2002 | Kubo et al. | 522/100 |
| 6,582,862 B1 * | 6/2003 | Nakamura et al. | 430/7 |
| 6,730,763 B1 * | 5/2004 | Okazaki et al. | 526/262 |

FOREIGN PATENT DOCUMENTS

| | | |
|---|---|---|
| JP | 06-082620 | 3/1994 |
| JP | 09-304922 | 11/1997 |
| JP | 10-082909 | 3/1998 |
| JP | 11-023833 | 1/1999 |
| JP | 11-109616 | 4/1999 |
| JP | 11-142637 | 5/1999 |
| JP | 2000235259 | 8/2000 |
| JP | 2000-105456 | 4/2002 |
| JP | 2002-116538 | 4/2002 |

\* cited by examiner

CURABLE RESIN FOR PHOTO-PATTERNING, PROCESS FOR PRODUCING THE SAME, CURABLE RESIN COMPOSITION, COLOR FILTER, LIQUID CRYSTAL PANEL SUBSTRATE, AND LIQUID CRYSTAL PANEL

BACKGROUND OF THE INVENTION

1. Field of the Invention

The present invention relates to a curable resin for photo-patterning, a process for producing the same, a curable resin composition for photo-patterning, comprising the curable resin for photo-patterning, a color filter using the curable resin composition for photo-patterning, a liquid crystal panel substrate making it possible to maintain an even cell gap, and a liquid crystal panel superior in display quality, using the color filter or the liquid crystal panel substrate.

2. Description of Related Art

In a liquid crystal panel, a display side substrate and a liquid crystal driving side substrate are faced with each other and a liquid crystal compound is put between the two to form a thin liquid crystal layer. The liquid crystalline order in the liquid crystal layer is electrically controlled through the liquid crystal driving side substrate to change the amount of light transmitted through the display side substrate or light reflected thereon, thereby performing display.

For a liquid crystal panel, various driving systems are known, examples of which include a static driving system, a simple matrix system, and an active matrix system. In recent years, color liquid crystal display devices using a liquid crystal panel according to an active matrix system or a simple matrix system have spread rapidly as flat displays for personal computers, portable information terminals and so on.

FIG. 1 illustrates an example of a liquid crystal panel according to an active matrix system. A liquid crystal panel 101 has a structure wherein a color filter 1, which is a display side substrate, is faced with a TFT array substrate 2, which is a liquid crystal driving side substrate, to form a gap part 3 of about 1 to 10 µm; the gap 3 is filled with a liquid crystal L; and the periphery thereof is sealed up with a sealing material 4. The color filter 1 comprises a structure including a black matrix layer 6 formed in a given pattern for shading light from the boundary part between the pixels, a color layer 7 with a plurality of colors (in general, the three primary colors of red (R), green (G), and blue (B)) arranged in a given order for forming each pixel or a recent color layer using a hologram, a protect layer 8, and a transparent electrode layer 9 successively laminated on a transparent substrate 5 in this order from the side close to the transparent substrate. The TFT array substrate 2 has a structure wherein TFT elements are arranged on the transparent substrate and the transparent electrode layer is deposited (not illustrated). Moreover, an alignment layer 10 is provided on the inner surface side of the color filter 1 and the TFT array substrate 2 facing thereto. Furthermore, spherical or rod-like particles 11, which have a constant size and are made of glass, alumina, a plastic or the like, are dispersed as spacers in the gap part 3 for constantly and homogeneously maintaining the cell gap between the color filter 1 and the electrode substrate 2. A color image can be obtained by controlling the light transmittance of the pixels colored in respective colors or the liquid crystal layer behind the color filter.

The protect layer 8 formed in the color filter serves for protecting the color layer and for flattening the color filter when a color layer is provided in the color filter. In a color liquid crystal display device, when the flatness of the transparent electrode layer 9 deteriorates due to the existence of gap unevenness derived from waviness on the surface of the transparent substrate of the color filter, gap unevenness among the R, G and B pixels, or gap unevenness within each pixel, color unevenness or contrast unevenness is generated so as to give rise to a problem of image quality deterioration. Therefore, a high flatness is required for the protect layer.

When the fine particles 11 as shown in FIG. 1 are dispersed as the spacers, the particles 11 are randomly dispersed whether they are behind the black matrix layer 6 or behind the pixels. When the particles 11 are disposed in the display region, that is, in the color layer, a back lighting beam transmits the particle part and further the orientation of the liquid crystal is disturbed in the vicinity of the particles. As a result, the display image grade is remarkably deteriorated. Thus, as shown in FIG. 2, instead of dispersing the particles 11, column-shaped spacers 12 having a height corresponding to the cell gap are formed on the inner surface side of the color filter and in the region coinciding with the black matrix layer 6 (namely, non-display region).

The color layer 7, the protect layer 8 and the column-shaped spacers 12 can be made of a resin. It is necessary that in the color layer 7, a given pattern is formed for pixels in each color. Considering the adhesion property and the sealing property of the sealing part, the protect layer 8 is preferably one capable of covering only the region of the transparent substrate with the color layer formed thereon. Moreover, the column-shaped spacers 12 need to be formed accurately in the region with the black matrix layer formed, that is, in the non-display region. Therefore, it is suggested that the color layer, the protect layer and the column-shaped spacers are formed with the use of a photo-curable resin which can be developed with an alkali after regions to be cured is selectively exposed to light.

As an alkali-soluble photo-curing resin, for example, o-cresol novolak epoxy acrylate having a weight average molecular weight of about 2000 is known. The resin has a carboxylic acid group defining the alkali solubility. However, since the resin uses a monomer component as an acryloyl group defining the curability, the reliability in film formation is low. For example, it involves the risk of the elution of remaining monomer units into the liquid crystal part. Furthermore, the layer thickness may be reduced due to a large amount of the elution in the alkali development.

Moreover, as a method for introducing a radical polymerizable group such as an acryloyl group into the molecular structure of a compound to provide photo curability, there is known, for example, a method of introducing a radical polymerizable group such as a methacryloyl group to an end of the compound by reacting a diol with excessive diisocyanate to prepare a reaction product with an isocyanate group remaining on the end, and reacting the isocyanate group of the reaction product with 2-hydroxyl ethyl methacrylate to produce urethane acrylate. However, according to the method, as a principle, (meth)acryloyl groups can be introduced to only both ends of the molecular structure. Furthermore, the following method is conceivable: a method of conducting radical polymerization in the state that a polyfunctional compound having two or more radical polymerizable groups, such as (meth)acryloyl groups, in the single molecule thereof, is contained. However, the content of the radical polymerizable groups cannot be controlled and further a problem of gellation is also involved.

Thus, the inventors suggested a photo-curable resin having a main chain comprising a constitutional unit represented by the following formula (15) and a constitutional unit represented by the following formula (16) in which a (meth)acryloyloxyalkylisocyanate compound represented by the following formula (17) is bonded with at least one part of carboxyl groups and hydroxyl groups of the main chain by reaction of the isocyanate group of this compound:

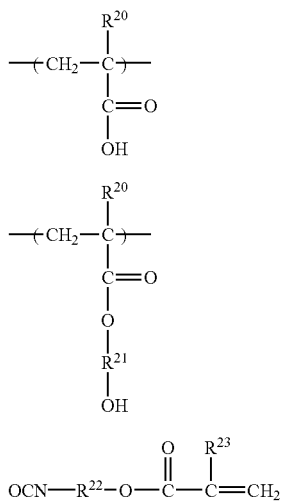

wherein $R^{20}$ represents hydrogen or an alkyl group having 1 to 5 carbon atoms, $R^{21}$ represents an alkylene group having 2 to 4 carbon atoms, $R^{22}$ represents an alkylene group, and $R^{23}$ represents hydrogen or methyl.

A Japanese Patent Application (No. 2000-105456) for this resin was filed.

The photo-curable resin concerned with this suggestion has an advantage that the quantities of the carboxyl groups, which are alkali-soluble, and the (meth) acryloyl groups, which are radical-polymerizable, can be freely adjusted. However, it cannot be said that the resin has sufficient sensitivity. Thus, in order to cure the resin rapidly at a little exposure amount, it is necessary to use a relatively large amount of a photopolymerization initiator. However, if the photopolymerization initiator is used in a large amount, disadvantages as follows are generated: the resin is easily colored; an effect as an impurity becomes large so as to cause particularly liquid crystal pollution; and the photopolymerization initiator bleeds out to the surface of the coating layer so that physical properties of the layer are damaged.

Column-shaped spacers formed using a conventional photo-curable resin used in photolithography are plastically deformed at high temperature and high pressure at the time of assembling a color filter and a TFT array substrate (forming a cell by adhesion under pressure (cell pressure adhesion)). As a result, a cell gap having a given interval cannot be kept even so that display unevenness and so on are generated. Thus, a problem that the spacers are prohibited from fulfilling their original function arises.

The column-shaped spacers made of the curable resin are also plastically deformed by impact or pressing force from the outside after the color filter and the TFT array are assembled to form a liquid crystal panel. As a result, its cell gap becomes uneven to generate display unevenness. Thus, the spacers may also be prohibited from fulfilling their original function.

When the hardness of the column-shaped spacers is made high to prevent such plastic deformation, the spacers cannot follow contraction and expansion of liquid crystal within a wide practical temperature range (−20 to +40° C.), to cause problems that foams are generated in the liquid crystal layer to results in a problem of a drop in display quality, based on color omission (void), color unevenness, and so on.

In order to make the cell gap precise and even by the column-shaped spacers, it is necessary to overcome the above-mentioned problems.

In recent years, an increase in the area of liquid crystal display devices have been advancing, and the necessity that their cell gap should be kept even over the whole of their wide substrate has been becoming larger. When the area of the substrate is large, the substrate is distorted even by a relatively small external force. Therefore, the necessity that the unevenness of the gap based on such a distortion should be prevented has also been generated. In recent years, the thickness of the liquid crystal layer, that is, the cell gap has become smaller in order to improve display responsibility. Thus, the necessity that the small gap should be precisely maintained has also been generated.

Following such a late increase in the display region of liquid crystal display devices and such a late reduction in the cell gap thereof, display performance thereof is largely affected even if the evenness of the cell gap is slightly damaged. Thus, display quality is easily lowered because of display unevenness and so on. Consequently, preciseness and evenness are more and more strictly demanded for the cell gap.

In recent years, in order to remove a heating process and a slow cooling process from the process for assembling a color filter and a TFT array substrate (cell pressure adhesion) so as to make the process simpler and improve productivity, a method of performing cell pressure adhesion at room temperature (room-temperature cell pressure adhesion method) has been suggested.

In order to improve the productivity of the cell pressure adhesion process, a One Drop Fill Technology (ODF technique) is suggested (1354·SID 01 DIGEST, 56. 3: development of One Drop Fill technology for AM-LCDs (H. Kamiya et al.)). In this method, a given amount of a liquid crystal droplet is dropwise added to a liquid crystal enclosing face of a liquid crystal panel substrate such as a color filter or a TFT array substrate, and another liquid crystal panel substrate is opposed and adhered thereto in a vacuum in the state that a given cell gap can be kept. This method can make the processes thereof simpler than any conventional cell pressure adhesion process. According to any conventional cell pressure adhesion process, a color filter and a TFT array substrate are opposed and adhered to each other in the state that a given cell gap can be kept, and subsequently a liquid crystal is filled and put into the cell gap from a filling-opening made in an end of the adhesion product, using a capillary phenomenon and a difference between pressures inside and outside the cell gap. Following the above-mentioned increase in the display region and the reduction in the cell gap, it has been becoming difficult that the liquid crystal is smoothly filled into the gap. On the other hand, according to the ODF technology, a liquid crystal is easily filled into a cell gap even if the area of a liquid crystal panel substrate becomes large and its cell gap is narrow. This new method, which is superior in productivity, may become the main current hereafter.

Japanese Patent Application Laid-Open No. 6-82620 discloses a method of exposing, to light, a layer comprising a photo-crosslinking polymer wherein a monomer (A) having a cyclic imide group, a monomer (B) having an acid group such as (meth)acrylic acid, and a monomer (C) which is different from the monomers (A) and (B) are copolymerized so as to form a protect layer for a color filter. This publication states that the color filter protect layer obtained by using the photo-crosslinking polymer according to the suggestion therein is superior in adhesiveness, heat resistance, and chemical resistance.

Japanese Patent Application Laid-Open No. 2000-235259 describes an active energy ray curable resist which comprises: a copolymer (A) having a constitutional unit made of a compound having an ethylenic unsaturated group and a cyclic imide group, and an ethylenic unsaturated monomer; and a compound having 2 or more (meth) acryloyl groups, the resist being used mainly as a solder resist, an etching resist or a plating resist. This publication states that: the active energy ray curable resist according to the suggestion therein is easily cured by active energy rays; the resist has a superior curability, with no photopolymerization initiator or a small amount of a photopolymerization initiator being added, even when the resist is cured by ultraviolet rays; and the cured product is superior in heat resistance and chemical resistance.

SUMMARY OF THE INVENTION

In view of such situations, the present invention has been made. A first object of the present invention is to provide a curable resin which has alkali-solubility and curability that can be freely adjusted, and which can be promptly cured at a small exposure amount owing to a high sensitivity even when only a small amount of a photopolymerization initiator is used.

A second object of the present invention is to provide a process for producing the curable resin according to the above-mentioned present invention.

A third object of the present invention is to provide a curable resin composition which has alkali-solubility and curability that can be freely adjusted, and which can be promptly cured at a small exposure amount owing to a high sensitivity even when only a small amount of a photopolymerization initiator is used.

A fourth object of the present invention is to provide a photosensitive resin composition for patterning, which is capable of forming a spacer that is superior in elastic deformation modulus at room temperature and particularly has such a sufficient hardness that the spacer is not easily deformed at the time of performing cell pressure adhesion for a liquid crystal panel as described above or subsequent handling of the panel, and flexibility that can follow thermal contraction and expansion of the liquid crystal.

A fifth object of the present invention is to provide a color filter wherein yellowing is not easily caused.

A sixth object of the present invention is to provide a liquid crystal panel substrate which has a spacer having such a sufficient hardness that the spacer is not easily deformed at the time of performing cell pressure adhesion or subsequent handling of the panel, and flexibility that can follow thermal contraction and expansion of a liquid crystal, and which can make a cell gap precise and even and maintain the cell gap.

A seventh object of the present invention is to provide a liquid crystal panel substrate which has a spacer making it possible to keep a cell gap precise and even when the display region in a liquid crystal display device is large or the cell gap is very narrow, and which can cope with a late increase in the display region and a late reduction in the cell gap.

An eight object of the present invention is to provide a liquid crystal panel substrate which has a spacer making it possible to form a cell gap precisely and evenly without being plastically deformed when the panel is used for a room-temperature cell pressure adhesion method (particularly when room-temperature cell pressure adhesion is performed in the ODF technology).

A ninth object of the present invention is to provide a liquid crystal panel superior in display quality, using a color filter or a liquid crystal panel substrate according to the above-mentioned present invention.

The curable resin for photo-patterning provided in the present invention is a curable resin for photo-patterning, comprising an imide-containing copolymer having a molecular structure wherein at least the following units are connected: a constitutional unit having a cyclic imide group represented by the following formula (1):

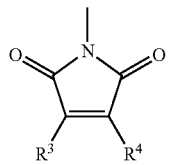

FORMULA(1)

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group other than the cyclic imide group. Hereafter, "a photopolymerizing functional group other than the cyclicimide group" may be referred to merely as "a photopolymerizing functional group".

Since the molecular structure of the imide-containing copolymer comprises not only the cyclic imide-containing unit but also the acid functional group-containing unit and the photopolymerizing functional group-containing unit, superior photopolymerization reactivity and alkali-solubility can be obtained.

The constitutional unit having a photopolymerizing functional group preferably comprises an ethylenic unsaturated bond as the photopolymerizing functional group. The ethylenic unsaturated bond can form a crosslink by radical photopolymerization also with the cyclic imide group represented by the formula (1).

In one embodiment, the imide-containing copolymer may comprise, as the constitutional unit having a photopolymerizing functional group, a constitutional unit represented by the following formula (4) or a constitutional unit represented by the following (5):

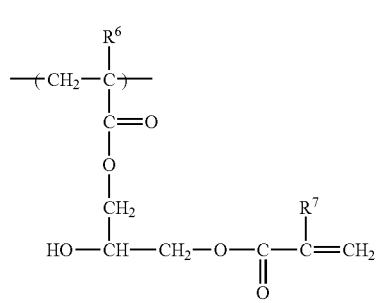

FORMULA(4)

wherein $R^6$ and $R^7$ each independently represent a hydrogen atom or a methyl group,

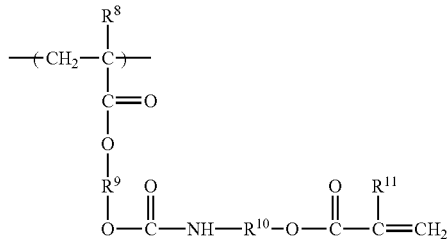

FORMULA(5)

wherein $R^8$ and $R^{11}$ each independently represent a hydrogen atom or a methyl group, $R^9$ represents an alkylene group having 2 to 4 carbon atoms, and $R^{10}$ represents an alkylene group.

In another embodiment, the imide-containing copolymer comprises, as the constitutional unit having a cyclicimide group, a constitutional unit represented by the following formula (2) and comprises, as the constitutional unit having an acid functional group, a constitutional unit represented by the following formula (3):

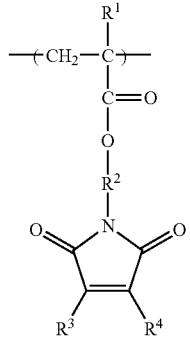

FORMULA(2)

wherein $R^1$ represents a hydrogen atom or a methyl group, $R^2$ represents an alkylene group having 1 to 6 carbon atoms, and $R^3$ and $R^4$ are the same as described above.

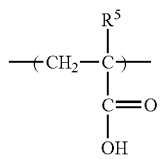

FORMULA(3)

wherein $R^5$ represents a hydrogen atom or a methyl group.

The imide-containing copolymer preferably has, in the molecule thereof, an alcoholic hydroxyl group.

In order to produce the curable resin comprising the imide-containing copolymer, the following process may be adopted: a process of producing a polymer (starting polymer) having a main chain comprising a constitutional unit having a cyclic imide group represented by the formula (1), a constitutional unit having an acid functional group, and a constitutional unit having a functional group to which a pendant structure having a photopolymerizing functional group can be afterwards introduced, and then reacting the starting polymer with a compound having the photopolymerizing functional group and a different functional group, thereby introducing the pendant structure of the photopolymerizing functional group.

In one aspect, the curable resin for photo-patterning of the present invention can be produced by reacting, with glycidyl acrylate and/or glycidylmethacrylate, a starting polymer having a molecular structure wherein at least the following units are connected: a constitutional unit having a cyclic imide group represented by the formula (1) and a constitutional unit having an acid functional group.

In another aspect, the curable resin for photo-patterning of the present invention can be produced by reacting, with an isocyanate compound represented by the following formula (6):

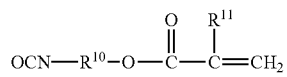

FORMULA(6)

wherein $R^{10}$ represents an alkylene group and $R^{11}$ represents a hydrogen atom or a methyl group, a starting polymer having a molecular structure wherein the following units are connected: a constitutional unit having a cyclic imide group represented by the formula (1); a constitutional unit having an acid functional group; and a constitutional unit having a hydroxyl group with.

The curable resin composition for photo-patterning, provided in the present invention, comprises, as an essential component, the curable resin (a) for photo-patterning according to the present invention.

When the curable resin composition for photo-patterning of the present invention is applied onto a support to form a coating layer and then active energy rays such as ultraviolet rays or ionizing radiation rays are radiated on the coating layer, the photopolymerizing functional group and the cyclic imide groups of the imide-containing copolymer and a polyfunctional polymerizable compound such as an acrylic monomer having two or more function groups undergo radical photopolymerization reaction and further the cyclic imide groups undergo dimerization-reaction with each other. In this way, crosslinks are formed between the molecules of the imide-containing copolymer and the copolymer is cured.

In this curable resin composition, the photopolymerizing functional group and the cyclic imide group are present together in the molecule of the imide-containing copolymer, which is a main polymer. Because the reactivity of the cyclic imide group is high and the reaction point density (concentration) of crosslinking reaction is high, a very high exposure sensitivity is exhibited only by using a small amount of a photopolymerization initiator. Moreover, the composition can be cured by a little exposure amount or in a very short exposure time. It is therefore possible to make a time necessary for patterning short and further save energy for the exposure and the use amount of the photopolymerization initiator. Since the use amount of the photopolymerization initiator is small, yellowing of the cured product (particularly yellowing at the time of using the composition for a protect layer or a color layer of a color filter) is not easily generated after the composition is cured. Thus, the composition is superior in transparency. Furthermore, in the curable resin composition for photo-patterning of the present invention, the cyclic imide group contributes to crosslinking reaction and the reaction point density of the crosslinking reaction is high; therefore, this composition is superior in various physical properties such as coating layer strength, heat resistance and chemical resistance after the composition is cured.

The curable resin composition for photo-patterning of the present invention is suitable for forming a color layer of a color filter, a protect layer for covering the color layer, and a column-shaped spacer for maintaining a cell gap of a liquid crystal panel. Thus, a color layer and a protect layer having a desired thickness and a column-shaped spacer having a desired height can be precisely formed. The composition is also superior in transparency and other physical properties after the composition is cured.

In one aspect, the elastic deformation modulus "(elastic deformation quantity/total deformation quantity)×100" of the above-mentioned curable composition for photo-patterning is 60% or more against a compressive load of 2.0 GPa at room temperature after the composition is cured. In this case, the resin composition can be used as a material for patterning which exhibits a large elastic deformation modulus and a small plastic deformation modulus at room temperature after the composition is cured. The resin composition can be used suitably particularly for forming a convex spacer of a liquid crystal panel.

Preferably, the curable resin composition further comprises a compound (b) having 2 or more mercapto groups, which is referred to merely as a "polyfunctional thiol compound" hereinafter. In this case, the reactivity of the cyclic imide group and the photopolymerizing functional group which the curable resin (a) for photo-patterning has is heightened when the curable resin composition is photo-cured. In other words, since the cyclic imide group pulls out hydrogen of the mercapto group in the polyfunctional thiol compound (b) so as to generate a radical, a curable resin composition having a very high sensitivity can be obtained by using a combination of the polyfunctional thiol compound (b) with the curable resin (a) for photo-patterning.

The polyfunctional thiol compound (b) also has a function of improving thermal discoloration resistance of the curable resin composition. Thus, by combining this with the curable resin (a) for photo-patterning, the thermal discoloration resistance can be further improved and yellowing is generated with more difficulty.

The polyfunctional thiol compound (b) is preferably a compound having 3 or more mercapto groups.

The above-mentioned curable resin composition may comprise a photopolymerizable compound (c) having 2 or more photopolymerizing functional groups, which is referred to merely as a "photopolymerizable compound" hereinafter. When the photopolymerizable compound (c) is incorporated into the curable resin composition, the crosslink density of the coating layer can be improved and further the sensitivity of the curable resin composition can be improved even if the blend amount of the polyfunctional thiol compound (b) is made small. Since the odor of the polyfunctional thiol compound (b) is very strong, working hygiene can be improved by decreasing the use amount thereof. The photopolymerizable compound (c) is preferably a compound having an ethylenic unsaturated bond as a photopolymerizing functional group. The photopolymerizable compound having 2 or more ethylenic unsaturated bonds can be combined with the ethylenic unsaturated bonds or the cyclic imide group of the curable resin (a) for photo-patterning so as to form a crosslink.

The photopolymerizable compound (c) to be incorporated into the curable resin composition is preferably a photopolymerizable compound having 3 or more ethylenic unsaturated bonds and an alcoholic hydroxyl group since the reactivity of the composition becomes high to improve the sensitivity and curability thereof.

If necessary, the above-mentioned curable resin composition may further comprise a photopolymerization initiator.

When the curable resin composition according to the present invention comprises the polyfunctional thiol compound (b), the curable resin composition preferably comprises, as solid contents, and 5 to 80% by weight of the curable resin (a) for photo-patterning, 0.01 to 60% by weight of the polyfunctional thiol compound (b). When the curable resin composition comprises the photopolymerizable compound (c), the curable resin composition according to the present invention preferably comprises, as solid contents, 5 to 80% by weight of the curable resin (a) for photo-patterning, 0.01 to 20% by weight of the polyfunctional thiol compound (b), and 3 to 80% by weight of the photopolymerizable compound (c).

The color filter provided in the present invention comprises a transparent substrate, a color layer disposed on the transparent substrate, and may further comprise a protect layer for covering the color layer and/or a spacer disposed in a non-display region of the substrate, wherein at least one of the color layer, the protect layer and the spacer is formed by curing the above-mentioned curable resin composition for photo-patterning.

In the color filter of the present invention, the curable resin composition for photo-patterning according to the present invention is used to form the color layer, the protect layer or the spacer; therefore, the color layer and the protect layer have a high transparency, yellowing is not easily generated and the color layer, the protect layer and the spacer have high precision and evenness.

In the liquid crystal panel substrate according to the present invention, plural spacers are disposed in a non-display region on a substrate, and the spacers are formed by curing the curable resin composition for photo-patterning according to the present invention. The elastic deformation modulus "(elastic deformation quantity/total deformation quantity)× 100" of the spacers is 60% or more against a compressive load of 2.0 GPa at room temperature.

The spacers have a sufficient hardness that the spacers are not easily plastically deformed at room temperature against the compressive load, and a flexibility that can follow contraction and expansion of liquid crystal within a use environment temperature range of a liquid crystal display device.

Accordingly, when the liquid crystal panel substrate according to the present invention and a partner substrate are adhered to each other by the room-temperature cell pressure adhesion method, a load is made even over the whole of the substrate by relief and absorption of pressure unevenness so that the generation of gap unevenness can be prevented. Furthermore, after the compressive load is released, the height of the adhered substrates is almost completely restored to the original height thereof so that the cell gap can be kept at a given distance.

Even if the completed liquid crystal panel is temporarily distorted when external force such as impact or pressing force is applied to the panel, the cell gap is restored to the original state so that display unevenness can be prevented. Furthermore, the generation of foams can be prevented since the panel can follow thermal contraction and expansion of the liquid crystal within a wide temperature range including room temperature.

The spacers of the liquid crystal panel substrate according to the present invention are very satisfactorily restored to the original state even if the spacers are deformed by a compressive load. Therefore, even if the display region of a liquid crystal display device is large or the cell gap thereof is very narrow, the liquid crystal panel substrate according to the present invention can cause the cell gap to be kept precise and even.

The spacers of the liquid crystal panel substrate according to the present invention exhibit appropriate elastic deformation at room temperature. Accordingly, when the liquid crystal panel substrate according to the present invention is subjected to adhesion by the room-temperature cell pressure adhesion method, no plastic deformation is caused so that a precise and even cell gap can be formed. The column-shaped spacers of the liquid crystal panel substrate according to the present invention can be suitably used when room-temperature cell pressure adhesion is performed in the ODF technology.

In the liquid crystal panel according to the present invention, a display side substrate and a liquid crystal driving side substrate are faced with each other, a liquid crystal is put between the two and at least one of the display side substrate and the liquid crystal driving side substrate is a color filter or a liquid crystal panel substrate according to the present invention.

In the liquid crystal panel according to the present invention, the transparency and the heat resistance of its display section are superior and a yellowing phenomenon is not easily generated. Moreover, at the time of cell pressure adhesion and subsequent handling of the cell, the cell gap can be kept precise and even. For these reasons, display unevenness is not easily generated and the display quality of the panel is superior.

DETAILED DESCRIPTION OF THE PREFERRED EMBODIMENTS

Figure 1:
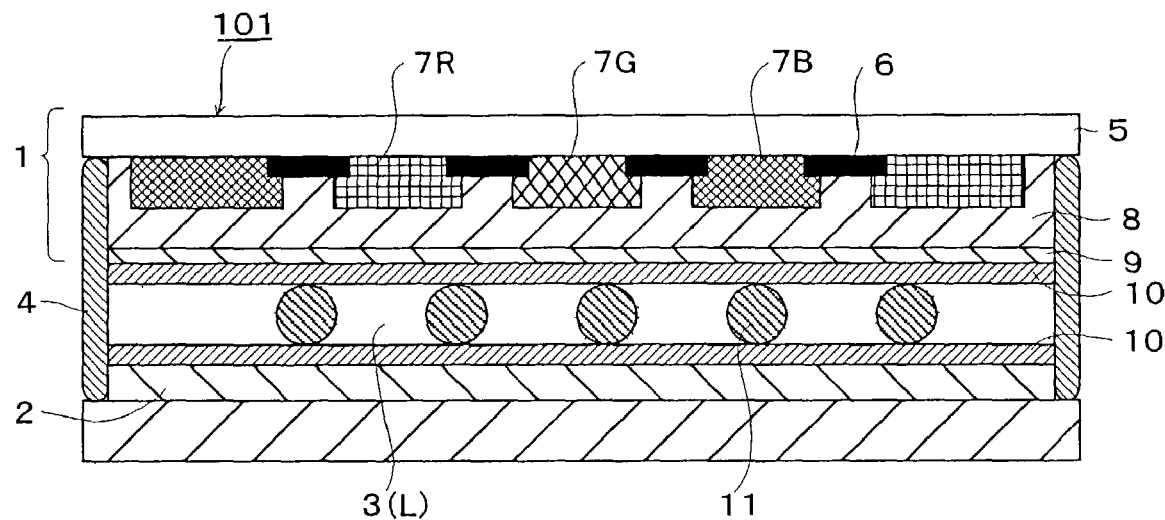
FIG. 1 is a schematic sectional view of one example of conventional liquid crystal panels.

The present invention will be described in detail hereinafter. In the present invention, (meth)acryl means either of an acryl group or a methacryl group, and (meth) acrylate means either of acrylate or methacrylate. (Meth)acryloyl means an acryloyl group or a methacryloyl group.

The curable resin for photo-patterning provided by the present invention comprises an imide-containing copolymer having a molecular structure wherein at least the following are connected: a constitutional unit having a cyclic imide group represented by the following formula (1):

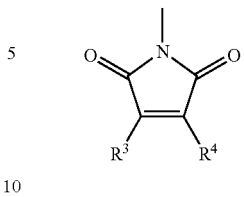

FORMULA(1)

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group.

The constitutional unit having a cyclic imide group represented by the formula (1) (cyclic imide-containing unit) is a component contributing to the sensitivity of photo-curing reaction, the heat resistance and chemical resistance of the cured coating layer, the elastic deformation modulus or the total deformation modulus at room temperature after the resin is cured, and other physical properties. The content thereof by percentage is adjusted considering these physical properties, particularly the degree of the sensitivity required for the curable resin, and the elastic deformation modulus and the total deformation modulus at room temperature when the resin is used as a spacer. The monomer used to introduce the cyclic imide-containing unit into the main chain of the polymer may be a compound having an ethylenic unsaturated bond for forming a linkage of the main chain, as well as the cyclic imide group.

Examples of the cyclic imide group represented by the formula (1) include groups represented by the following formulae (1a) to (1c):

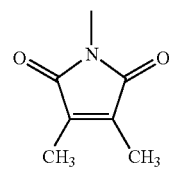

FORMULA(1a)

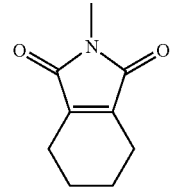

FORMULA(1b)

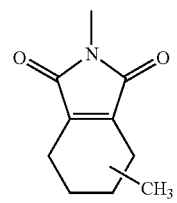

FORMULA(1c)

Examples of the constitutional unit having a cyclic imide group represented by the formula (1) include units represented by the following formulae (7a) to (7c):

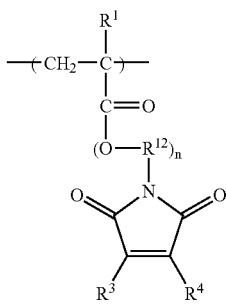

FORMULA(7a)

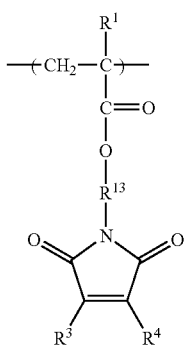

FORMULA(7b)

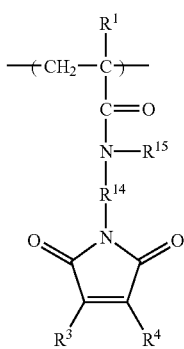

FORMULA(7c)

wherein $R^1$ represents a hydrogen atom or a methyl group; $R^3$ and $R^4$, which are the same as described above, each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; $R^{12}$ represents an alkylene group having 1 to 6 carbon atoms; n is an integer of 1 to 6; $R^{13}$ represents a cycloalkylene group; $R^{14}$ represents an alkylene group or a cycloalkylene group; and $R^{15}$ represents a hydrogen atom or an alkyl group. The constitutional unit represented by each of these formulae (7a) to (7c) is linked to some other main chain constitutional unit, whereby a pendant structure containing the cyclic imide group can be introduced into the molecule of the copolymer.

Among the above-mentioned constitutional units, preferable is a cyclic imide-containing unit represented by the following formula (2):

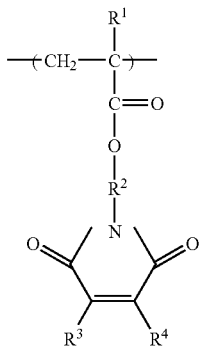

FORMULA (2)

wherein $R^1$, which is the same as described above, represents a hydrogen atom or a methyl group; $R^2$ represents an alkylene group having 1 to 6 carbon atoms; and $R^3$ and $R^4$, which are the same as described above, each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring.

The constitutional unit having an acid functional group (acid functional group-containing unit) is a component contributing to alkali-solubility, and the content thereof by percentage is adjusted considering the degree of the alkali-solubility required for the curable resin. The monomer used to introduce the acid functional group-containing unit into the main chain of the imide-containing copolymer may be a compound having an ethylenic unsaturated bond and an acid functional group. The acid functional group is usually a carboxylic group, but may be a group other than the carboxylic group if the group can contribute to the alkali-solubility.

The acid functional group-containing unit is preferably a constitutional unit represented by the following formula (3):

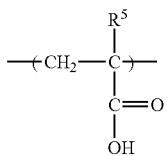

FORMULA (3)

wherein $R^5$ represents a hydrogen atom or a methyl group.

The monomer used to introduce the constitutional unit represented by the formula (3) maybe acrylic acid or methacrylic acid.

The constitutional unit having a photopolymerizing functional group (photopolymerizing functional group-containing unit) is a component contributing to the photo-curability of the resin in the same way as the constitutional unit having a cyclic imide group represented by the formula (1). The content thereof by percentage is adjusted considering the degree of the photo-curability required for the resin.

The photopolymerizing functional group may be one selected from groups using various reaction systems, such as radical photopolymerization, cationic photopolymerization and anionic photopolymerization, and is preferably a radical photopolymerizing functional group which can also be photopolymerized with the cyclic imide group represented by the formula (1), particularly preferably an ethylenic unsaturated bond.

In order to introduce the photopolymerizing functional group-containing unit into the main chain of the imide-containing copolymer, a compound having an ethylenic unsaturated bond and a photopolymerizing functional group may be used. However, dependently on the kind of the photopolymerizing functional group, there may give rise to a problem that this group also undergoes copolymerization under reaction conditions for forming the main chain linkage of the imide-containing copolymer. For example, when it is desired to introduce a constitutional unit having an ethylenic unsaturated bond as the photopolymerizing functional group, both of a functional group for forming the main chain linkage and the photopolymerizing functional group are ethylenic unsaturated bonds. If a monomer having two or more ethylenic unsaturated bonds is used to attempt to form the main chain linkage of the imide-containing copolymer, a crosslinking reaction is caused. Thus, it is difficult to introduce a desired constitutional unit. Thus, it is preferable to introduce the photopolymerizing functional group into the main chain of the copolymer through an appropriate functional group after the main chain linkage of the imide-containing copolymer is formed.

The constitutional unit having an ethylenic unsaturated bond (ethylenic unsaturated bond-containing unit) as the photopolymerizing functional group is preferably a constitutional unit represented by the following formal (4):

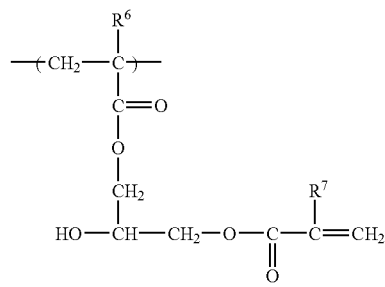

FORMULA (4)

wherein $R^6$ and $R^7$ each independently represent a hydrogen atom or a methyl group.

In order to introduce the constitutional unit of the formula (4) into the imide-containing copolymer, a cyclic imide-containing monomer and (meth)acrylic acid are first copolymerized to form the main chain portion of the imide-containing copolymer. Thereafter, the carboxylic group originating from the (meth)acrylic acid is reacted with glycidyl (meth)acrylate. However, if the amount of the carboxylic group originating from the (meth)acrylic acid is too small, the alkali-solubility is short. It is therefore necessary to adjust the amount of glycidyl (meth)acrylate appropriately.

The other preferable example of the ethylenic unsaturated bond-containing unit is a constitutional unit represented by the following formula (5):

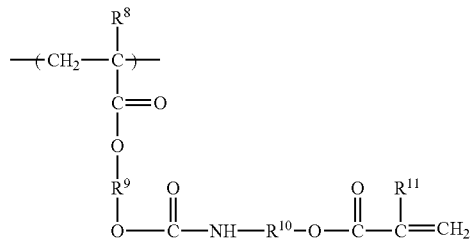

FORMULA (5)

wherein $R^8$ and $R^{11}$ each independently represent a hydrogen atom or a methyl group; $R^9$ represents an alkylene group having 2 to 4 carbon atoms; and $R^{10}$ represents an alkylene group.

$R^9$ contained in the formula (5) is an alkylene group having 2 to 4 carbon atoms. Examples thereof include ethylene, propylene, and butylene groups. $R^{10}$ is preferably an alkylene group having 2 to 6 carbon atoms.

In order to introduce the constitutional unit of the formula (5) into the imide-containing copolymer, a cyclic imide-containing monomer and (meth)acrylic acid are first copolymerized with a hydroxyalkyl (meth)acrylate represented by the following formula (8):

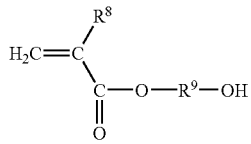

FORMULA (8)

wherein $R^8$ and $R^9$ are the same as described above, so as to form the main chain portion of the imide-containing copolymer.

Examples of the hydroxyalky (meth)acrylate include 2-hydroxyethyl acrylate, 2-hydroxyethyl methacrylate, 2-hydroxypropyl acrylate, 2-hydroxypropyl methacrylate, 4-hydroxybuytl acrylate, and 4-hydroxybutyl methacrylate.

Thereafter, the hydroxyl group originating from the hydroxyalkyl (meth)acrylate is reacted with an isocyanate compound represented by the following formula (6):

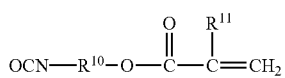

FORMULA (6)

wherein $R^{10}$ represents an alkylene group and $R^{11}$ represents a hydrogen atom or a methyl group.

Among (meth)acryloyloxyalkylisocyanates of the formula (6), isocyanates wherein a (meth)acryloyl group is bonded to an isocyanate group (—NCO) through an alkylene group having 2 to 6 carbon atoms are preferable. Specific examples thereof include 2-acryloyloxyethylisocyanate, and 2-methacryloylethylisocyanate. 2-Methacryloylethylisocyanate is commercially available as trade name "Carrens MOI" made by Showa Denko K.K.

The imide-containing copolymer contained in the curable resin for photo-patterning, provided by the present invention, comprises, as essential constitutional components of its main chain, the constitutional unit having a cyclic imide group represented by the formula (1), the constitutional unit having an acid functional group, and the constitutional unit having a photopolymerizing functional group, and may further comprise some other copolymerized component. The main chain may comprise, for example, a constitutional unit having an alcoholic hydroxyl group, a constitutional unit having an aromatic carbon ring, and/or a constitutional unit having an ester group.

The constitutional unit having an alcoholic hydroxyl group (alcoholic hydroxyl group-containing unit, such as an alcoholic hydroxyl group-containing methylene group or an alcoholic hydroxyl group-containing methine group) is a constitutional unit for generating a radical by the hydrogen pulling effect of the cyclic imide group when the curable resin is photo-cured, and whereby heightening the reactivity of the cyclic imide group and the alcoholic hydroxyl group-containing unit. As the monomer used to introduce the constitutional unit having an alcoholic hydroxyl group to the main chain of the imide-containing copolymer, a compound having an ethylenic unsaturated bond and an alcoholic hydroxyl group may be used. The alcoholic hydroxyl group may be contained in the cyclic imide-containing unit.

The alcoholic hydroxyl group-containing unit is preferably a constitutional unit represented by the following formula (9):

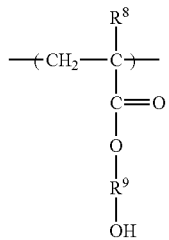

FORMULA (9)

wherein $R^8$ and $R^9$ are the same as in the formula (5).

The monomer used to introduce the constitutional unit of the formula (9) maybe a hydroxyalkyl (meth)acrylate represented by the above-mentioned formula (8). As described above, the hydroxyalkyl (meth)acrylate represented by the above-mentioned formula (8) is also used to be reacted with an ethylenic unsaturated bond-containing isocyanate compound, a typical example of which is (meth)acryloyloxyalkylisocyanate of the formula (6), so as to introduce an ethylenic unsaturated bond. Accordingly, the hydroxyalkyl (meth)acrylate represented by the formula (8) is copolymerized with a cyclic imide-containing monomer and (meth)acrylic acid to form the main chain portion of an imide-containing copolymer, and subsequently the hydroxyl group of its pendant structure moiety is reacted with an ethylenic unsaturated bond-containing isocyanate compound while the amount of this isocyanate compound is appropriately controlled, whereby an imide-containing copolymer having a hydroxyl group and an ethylenic unsaturated bond is obtained.

The constitutional unit having an aromatic carbon ring (aromatic carbon ring-containing unit) is a component for giving coating layer formability to the curable resin when the curable resin is used to form a coating layer such as a protect layer for a color filter. The monomer used to introduce the aromatic carbon ring-containing unit into the main chain of the polymer maybe a compound having an ethylenic unsaturated bond-containing group and an aromatic carbon ring.

The aromatic carbon ring-containing unit is preferably a constitutional unit representedby the following formula (10):

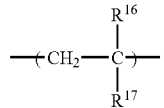

FORMULA (10)

wherein $R^{16}$ represents a hydrogen atom or a methyl group, and $R^{17}$ represents an aromatic carbon ring.

$R^{17}$ contained in the formula (10) is an aromatic carbon ring, and examples thereof include phenyl and naphthyl groups. The monomer used to introduce the constitutional unit of the formula (10) is, for example, styrene or α-methylstyrene. The aromatic ring may be substituted with a halogen atom such as chlorine or bromine, an alkyl group such as methyl or ethyl, an amino group such as amino or dialkylamino, a cyano group, a carboxyl group, a sulfonic acid group, a phosphoric acid group, or the like.

The constitutional unit having an ester group (ester group-containing unit) is a component for suppressing the alkali-solubility of the curable resin. The monomer used to introduce the ester group-containing unit into the main chain of the polymer may be a compound having an ethylenic unsaturated bond-containing group and an ester group.

The ester group-containing unit is preferably a unit represented by the following formula (11):

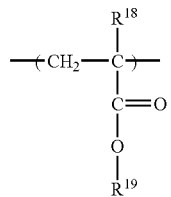

FORMULA (11)

wherein $R^{18}$ represents a hydrogen atom or a methyl group, and $R^{19}$ represents an alkyl group or an aralkyl group.

$R^{19}$ contained in the formula (11) is an alkyl group or an aralkyl group. Examples thereof include alkyl groups having 1 to 12 carbon atoms, and aralkyl groups such as a benzyl group and a phenylethyl group. Examples of the monomer used to introduce the constitutional unit of the formula (11) include (meth)acrylic acid esters such as methyl (meth)acrylate, ethyl (meth)acrylate, butyl (meth)acrylate, 2-ethylhexyl (meth)acrylate, phenyl (meth)acrylate, cyclohexyl (meth)acrylate, dicyclopentanyl (meth)acrylate, dicyclopentanyloxyethyl (meth)acrylate, isobornyl (meth)acrylate, benzyl (meth)acrylate, and phenylethyl (meth)acrylate.

About the monomer used to introduce each of the constitutional units into the main chain of the cyclic imide-containing copolymer, the compounds given as the examples may be used alone or in combination of two or more kinds thereof.

Particularly preferable examples of the cyclic imide-containing copolymer include a random copolymer or a block copolymer represented by the following formula (12) or (13), particularly the random copolymer:

FORMULA (12)

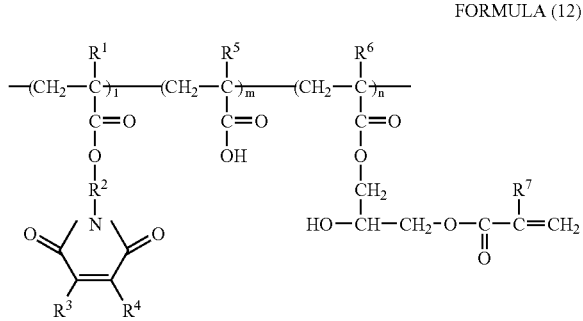

wherein $R^1$ to $R^7$ are the same as described above, and l, m and n are each an integer, and

FORMULA (13)

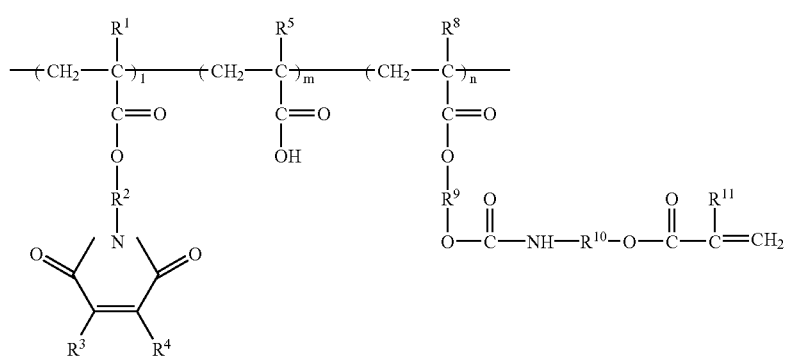

wherein $R^1$ to $R^5$ and $R^8$ to $R^{11}$ are the same as described above, and l, m and n are each an integer. The main chain of this copolymer may comprise some other constitutional unit if necessary.

In the present invention, the content by percentage of each of the constitutional units which constitute the molecular structure of the imide-containing copolymer is appropriately adjusted. When the content by percentage of the cyclic imide-containing unit is too small, the sensitivity of the photo-curing reaction is not sufficiently improved. Particularly when a spacer is formed, it is difficult to adjust the elastic deformation modulus and the total deformation modulus at room temperature after the resin is cured within good ranges. On the other hand, if the content by percentage of the cyclic imide-containing unit is too large, only curing of the surface of the coating layer to be obtained is promoted, resulting in a problem that the inside of the coating layer is not sufficiently cured. If the amount of the acid functional group-containing unit is too small, the alkali-solubility becomes insufficient. If the amount of the acid functional group-containing is too large, a problem that the solvent-solubility drops arises. If the amount of the photopolymerizing functional group-containing unit is too small, the curability becomes insufficient. On the other hand, if the amount of the constitutional unit having an ethylenic unsaturated bond as the photopolymerizing functional group is large, a problem that the adhesiveness to a substrate drops arises.

Specifically, by adjusting the content by percentage of the cyclic imide-containing unit in the imide-containing copolymer within the range of 10 to 90% by mole, preferably 40 to 80% by mole, in terms of a feed amount as the monomer, it is possible to optimize physical properties concerned with the cyclic imide-containing unit, for example, the elastic deformation modulus, the total deformation modulus, and photo-curing reactivity of the resin.

More specifically, in the case of the copolymer of the formula (12), the percentage of the cyclic imide-containing unit is set to about 10 to 90% by mole, the percentage of (meth)acrylic acid as the acid functional group-containing unit and the pendant linking moiety of the ethylenic unsaturated bond is set to about 5 to 85% by mole and the percentage of glycidyl (meth)acrylate as the pendant introducing unit of the ethylenic unsaturated bond is set to about 5 to 45% by mole in terms of feed amounts as the respective monomers.

In the case of the copolymer of the formula (13), the percentage of the cyclic imide-containing unit is set to about 10 to 90% by mole, the percentage of (meth)acrylic acid as the acid functional group-containing unit is set to about 8 to 88% by mole, the percentage of hydroxyalkyl (meth)acrylate as the alcoholic hydroxyl group-containing unit and the pendant linking unit of the ethylenic unsaturated bond is set to about 1 to 81% by mole, and the percentage of the isocyanate compound as the pendant introducing unit of the ethylenic unsaturated bond is set to about 1 to 45% by mole in terms of feed amounts as the respective monomers.

In order to produce the imide-containing copolymer, a polymer (starting polymer) is first produced which comprises a constitutional unit having a cyclic imide group represented by the formula (1), a constitutional unit having an acid functional group such as the formula (3), and a constitutional unit having a functional group capable of introducing a pendant structure having a photopolymerizing functional group afterward, and may optionally comprise a constitutional unit having an alcoholic hydroxyl group such as the formula (9), a constitutional unit having an aromatic carbon ring such as the formula (10), a constitutional unit having an ester group such as the formula (11), and some other constitutional unit. Thereafter, the starting polymer is reacted with a compound having a photopolymerizing functional group, such as an ethylenic unsaturated bond, and some other functional group. In this way, a pendant structure having the photopolymerizing functional group is introduced.

However, when the acid functional group-containing unit also functions as the pendant linking moiety of the photopolymerizing functional group, for example, when a constitutional unit, as represented by the formula (3), having a carboxyl group as the acid functional group-containing unit is used and glycidyl (meth)acrylate is used as the photopolymerizing functional group-containing compound, it is allowable that the main chain of the starting polymer does not comprise any constitutional unit having a functional group capable of introducing a photopolymerizing functional group afterward besides the acid functional group-containing unit.

When the alcoholic hydroxyl group-containing unit or some other additional constitutional unit also function as the pendant linking moiety of the photopolymerizing functional group-containing unit, for example, when the alcoholic hydroxyl group-containing unit is incorporated into the main chain of the starting polymer to improve the sensitivity of the cyclic imide group and the isocyanate compound, as represented by the formula (6), containing an ethylenic unsaturated bond as the photopolymerizing functional group-containing unit is used in combination, it is also allowable that the main chain of the starting polymer does not comprise any constitutional unit having a functional group capable of introducing a photopolymerizing functional group afterward besides the additional constitutional unit.

A polymerizing solvent used to produce the starting polymer is preferably a solvent not having any active hydrogen such as one contained in a hydroxyl group, an amino group or the like. Preferable examples thereof include ethers such as tetrahydrofuran; glycol ethers such as diethylene glycol dimethyl ether, diethylene glycol diethyl ether, and diethylene glycol methyl ethyl ether; cellosolves such as methylcellosolve acetate; propylene glycol monomethyl ether acetate; and 3-methoxybutyl acetate. An aromatic hydrocarbon, a ketone or an ester may be used.

As a polymerization initiator used to produce the starting polymer, a compound which is generally known as a radical polymerization initiator canbeused. Specific examples thereof include nitrile azo compounds (nitrile azo polymerization initiators) such as 2,2'-azobisisobutyronitrile, 2,2'-azobis-(2,4-dimethylvaleronitrile), and 2,2'-azobis- (4-methoxy-2,4-dimethylvaleronitrile); non-nitrile azo compounds (non-nitrile azo polymerization initiators) such as dimethyl 2,2'-azobis (2-methylpropionate), and 2,2'-azobis (2,4,4-trimethylpentane); organic peroxides (peroxide polymerization initiators) such as t-hexyl peroxypivalate, tert-butyl peroxypivalate, 3,5,5-trimethylhexanoylperoxide, octanoylperoxide, lauroylperoxide, stearoylperoxide, 1,1,3,3-tetramethylbutylperoxy-2-ethylhexanoate, succinic peroxide, 2,5-dimethyl-2,5-di(2-ethylhexanoylperoxy) hexane, 1-cyclohexyl-1-methylethylperoxy-2-ethylhexanoate, t-hexylperoxy-2-ethylhexanoate, 4-methylbenzoylperoxide, benzoylperoxide, and 1,1'-bis- (tert-butylperoxy) cyclohexane; and hydrogen peroxide. When a peroxide is used as the radical polymerization initiator, this may be combined with a reducing agent to use the combination as a redox polymerization initiator.

In the production of the starting polymer, a molecular weight adjusting agent may be used to adjust the weight average molecular weight thereof. Examples thereof include halogenated hydrocarbons such as chloroform and carbon tetrabromide; mercaptanes such as n-hexylmercaptane, n-octylmercaptane, n-dodecylmercaptane, tert-dodecylmercaptane, and thioglycolic acid; xanthogenes such as dimethylxanthogene disulfide and diisopropylxanthogene disulfide; and terpenolene and α-methylstyren dimmer.

The starting polymer may be a random copolymer or a block copolymer. When the random polymer is produced, a blend composition comprising monomers for deriving respective constitutional units, a catalyst and so on is dropwise added to a polymerizing tank in which a solvent is put at a temperature of 80 to 110° C. for 2 to 5 hours, and the composition is ripened, whereby polymerization can be performed.

The weight average molecular weight in terms of polystyrene (referred to merely as the "weight average molecular weight" or "Mw" hereinafter) of the starting polymer preferably ranges from 1,000 to 1,000,000, and the molecular weight preferably ranges from 3,000 to 1,000,000 particularly when a spacer is formed. Preferably, the acid value thereof ranges from 5 to 400 mgKOH/g, and the hydroxyl group value thereof ranges from 5 to 400 mgKOH/g.

The reaction for introducing a photopolymerizing functional group such as an ethylenic unsaturated bond into the starting polymer varies dependently on a combination of the molecular structure of the staring polymer and the molecular structure of the unit for introducing the photopolymerizing functional group.

When glycidyl (meth)acrylate, as an unit for introducing an ethylenic unsaturated unit, is reacted with the starting polymer which comprises the cyclic imide-containing unit represented by the formula (2) and the carboxyl group-containing unit represented by the formula (3) and may optionally comprise some other constitutional unit, the whole amount of the glycidyl (meth)acrylate is incorporated into the solution of the starting polymer at one time in the presence of a small amount of a catalyst and then reaction is continued for a given time, or the glycidyl (meth)acrylate is dropwise added little by little to the same solution in the presence of a small amount of a catalyst. In this way, a curable resin comprising an imide-containing copolymer represented by the formula (12) is obtained.

When an isocyanate compound represented by the formula (6), as an unit for introducing an ethylenic unsaturated unit, is reacted with the starting polymer which comprises the cyclic imide-containing unit represented by the formula (2), the carboxyl group-containing unit represented by the formula (3), and the hydroxyl group-containing unit represented by the formula (9) and may optionally comprise some other constitutional unit, the whole amount of the isocyanate compound is incorporated into the solution of the starting polymer at one time in the presence of a small amount of a catalyst and then reaction is continued for a given time, or the isocyanate compound is dropwise added little by little to the same solution in the presence of a small amount of a catalyst. In this way, a curable resin comprising an imide-containing copolymer represented by the formula (13) is obtained. In this case, as the catalyst, dibutyl tin laurate or the like is used. If necessary, a polymerization inhibitor is used, example of which include p-methoxyphenol, hydroquinone, naphthylamine, tert-butylcathecol, and 2,3-di-tert-butyl p-cresol.

The isocyanate compound having an ethylenic unsaturated bond undergoes an addition reaction, through the isocyanate group, to the alcoholic hydroxyl group of the starting polymer to form an urethane bond. As a result, the ethylenic unsaturated bond is introduced into the moiety of the hydroxyl group-containing unit represented by the formula (9) in the main chain of the starting polymer, to form a constitutional unit of the formula (5).

The isocyanate compound having an ethylenic unsaturated bond undergoes a condensation reaction accompanied by elimination of carbon dioxide gas, through the isocyanate group, to the carboxyl group of the starting polymer, to form an amide group. As a result, the ethylenic unsaturated bond is introduced into the moiety of the carboxyl group-containing unit represented by the formula (3) in the main chain of the starting polymer, as well. However, the reactivity of the isocyanate compound with the carboxyl group is by far smaller than that of the isocyanate compound with the alcoholic hydroxyl group; therefore, the ethylenic unsaturated bond is introduced mainly into the moiety of the alcoholic hydroxyl group-containing unit and the amount of the ethylenic unsaturated bond introduced into the moiety of the carboxyl group-containing unit is in general small. Accordingly, almost all amounts of the carboxyl group remain so that no alkali-solubility is lost.

When the thus-obtained curable resin is used to form a color layer of a color filter, a protect layer for covering the color layer, or a column-shaped spacer for maintaining a cell gap of a liquid crystal panel, it is preferable to set the weight average molecular weight in terms of styrene, measured by gel permeation chromatography (GPC), to 3,000 to 1,000,000, preferably 5,000 to 1,000,000, and more preferably 5,000 to 100,000. If the weight average molecular weight is less than 3,000, the alkali-solubility of the resin is too high so that the shape of a pattern in patterning exposure to light is not easily controlled. Moreover, problems that even if a pattern is formed, the final thickness of the pattern is reduced (film reduction) are caused. On the other hand, if the weight average molecular weight is more than 1,000,000, the viscosity of the resin, when being made up to a resist, is too high. As a result, the coating suitability of the resin deteriorates. Moreover, the developability thereof deteriorates so as to result in a problem that the pattern is not easily shaped up.

The acid value of the curable resin is preferably from 5 to 400 mgKOH/g, more preferably from 10 to 200 mgKOH/g. The acid value is related to alkali-solubility. If the acid value is too low, the developability is bad. Alternatively, the adhesiveness to a substrate and a color filter resin is poor. On the other hand, if the acid value is too high, the alkali-solubility is too large so as to result in problems such that in patterning exposure to light the shape of the pattern is not easily controlled. In the curable resin, the hydroxyl group value thereof can be adjusted to the range of 5 to 400 mgKOH/g.

The curable resin of the present invention has curability of photo-curing reaction, alkali-solubility, coating ability and other properties which can be appropriately adjusted. Additionally, the curable resin has a high sensitivity to exposure, and has superior heat resistance and chemical resistance after the resin is cured. Therefore, the resin can be suitably used as an effective component of a photo-curable coating material, and is particularly suitable for forming a color layer of a color filter, a protect layer thereof, and a convex spacer for maintaining a cell gap of a liquid crystal panel.

By incorporating a polyfunctional thiol compound (b), a photopolymerizable compound having 2 or more photopolymerizing functional groups (polyfunctional polymerizable compound) (c), a photopolymerization initiator, a sensitizer, and so on into the curable resin (a) for photo-patterning if necessary, a curable resin composition suitable for a photo-curable coating material can be obtained.

Into the curable resin composition for photo-patterning of the present invention, the curable resin for photo-patterning is incorporated usually at a ratio of 5 to 80% by weight, preferably 10 to 50% by weight as a solid content ratio (i.e., a ratio based on the total weight of solid contents). The total weight of solid contents means the total weight of all components except a solvent, which include any monomer component in a liquid state, other than the solvent.

If the content by percentage of the curable resin is more than 80% by weight, the viscosity of the coating liquid becomes too high so that the fluidity thereof drops and the coating ability deteriorates. On the other hand, if the content of the curable resin is less than 5% by weight, the viscosity of the coating liquid becomes too low so that the coating layer stability after the liquid is applied and dried becomes insufficient. Thus, problems that the exposure and development suitability of the coating layer are damaged may arise.

When the above-mentioned curable resin composition for photo-pattern is used to form a spacer, if the content by percentage of the curable resin is more than 80% by weight, the viscosity of the coating liquid becomes too high so that the fluidity thereof drops and the coating ability deteriorates. As a result, it becomes difficult to form an even and fine spacer. This unfavorably causes gap unevenness when a cell is fabricated. If the content of the curable resin is less than 5% by weight in this case, the elastic deformation modulus of a pattern formed by exposing this curable resin composition to light and developing the composition becomes small so that the pattern cannot be easily formed to have a large elastic deformation modulus and a small plastic deformation modulus within a wide temperature range. The elastic deformation modulus (%) and the plastic deformation modulus (%) are calculated from the following equations, respectively:

Elastic deformation modulus (%)=(elastic deformation quantity/total deformation quantity)×100,
and Plastic deformation modulus (%)=(plastic deformation quantity ($T2$)/total deformation quantity ($T1$))×100

The polyfunctional thiol compound (b) is a compound having, in the molecule thereof, 2 or more mercapto groups (—SH), preferably 3 or more mercapto groups, and more preferably 4 or more mercapto groups, and has an action of improving the photo-curing reactivity of the curable resin (a) for photo-patterning and improving the sensitivity and curability of the curable resin composition. The polyfunctional thiol compound heightens the reactivity of the cyclic imide group and the ethylenic unsaturated bond of the curable resin (a) for photo-patterning when the curable resin composition is photo-cured. Particularly, the cyclic imide group pulls out hydrogen of the mercapto group in the thiol compound to generate a radical; therefore, by combination use of this with the curable resin (a) for photo-patterning, a curable resin composition having a very high sensitivity can be obtained.

The polyfunctional thiol compound (b) also has an action of improving thermal discoloration resistance of the curable resin composition. A color film or a protect layer of a color filter is exposed to high temperature when the color filter is used to fabricate a liquid crystal panel. For example, in the process of forming an oriented layer, the color filter is heated at about 250° C. for about 1 hour. If the color film or the protect layer of the color filter does not have a sufficient thermal discoloration resistance, the layers get discolored in such a high-temperature heating process to cause a problem of yellowing and so on. In the present invention, in contrast, by combining the curable resin (a) for photo-patterning superior in thermal discoloration resistance with the polyfunctional thiol compound (b), the thermal discoloration resistance is further improved. It is therefore possible to yield a curable resin composition and a coating layer which are superior in thermal discoloration resistance and does not cause discoloration such as yellowing easily.

Specific examples of the polyfunctional thiol compound (b) include mercaptopropionic acid derivatives such as ethylene glycol bisthiopropionate (EGTP), butanediol bisthiopropionate (BDTP), trimethylolpropane tristhiopropionate (TMTP), pentaerythritol tetrakisthiopropionate (PETP), and THEIC-BMPA represented by the following formula (14):

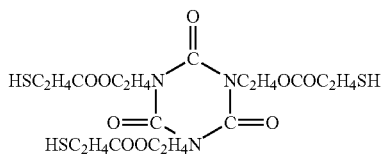

FORMULA (14)

thioglycol acid derivatives such as ethylene glycol bisthioglycolate (EGTG), butanediol bisthioglycolate (BDTG), hexanediol bisthioglycolate (HDTG), trimethylolpropane tristhioglycolate (TMTG), and pentaerythritol tetrakisthioglycolate (PETG); thiols such as 1,2-benzenedithiol, 1,3-benzenedithiol, 1,2-ethanedithiol, 1,3-propanedithiol, 1,6-hexamethylenedithiol, 2,2'-(ethylenedithio) diethanethiol, meso-2,3-dimercaptosuccinic acid, p-xylenedithiol, and m-xylenedithiol; and mercaptoethers such as di(mercaptoethyl) ether.

Among these examples, pentaerythritol tetrakisthiopropionate (PETP), THEIC-BMPA represented by the formula (14), and pentaerythritol tetrakisthioglycolate (PETG) are preferable.

The polyfunctional thiol compound (b) is incorporated into the curable resin composition according to the present invention usually at a ratio of 0.01 to 60% by weight, preferably 10 to 40% by weight as a solid content ratio. If the content by percentage of the polyfunctional thiol compound (b) is more than 60% by weight, the storage stability of the curable resin composition deteriorates. On the other hand, if the content of the polyfunctional thiol compound (b) is less than 0.01% by weight, a problem that sufficient reactivity cannot be obtained may be caused.

When the polyfunctional polymerizable compound (c) is incorporated into the curable resin composition, the crosslink density of the coating layer can be improved. Moreover, an effect of improving the sensitivity of the curable resin composition can be obtained even if the content of the polyfunctional thiol compound (b) is made small. The odor of the polyfunctional thiol compound (b) is very strong. Therefore, if it is used in a large amount, a problem about working hygiene is easily caused. In contrast, by combining the polyfunctional polymerizable compound (c) with the polyfunctional thiol compound (b), the use amount of the polyfunctional thiol compound (b) can be reduced so that working hygiene can be improved.

When the polyfunctional polymerizable compound (c) is incorporated into the curable resin composition, the polyfunctional thiol compound (b) is incorporated into the curable resin composition usually at a ratio of 0.01 to 20% by weight, preferably 0.1 to 10% by weight as a solid content ratio. In this way, a sufficient sensitivity can be obtained.

The polyfunctional polymerizable compound (c) is a compound which starts polymerization reaction of the compound itself by irradiation with light, or starts polymerization reaction by the action of an active species (such as a photopolymerization initiator) activated by irradiation with light, and is a component for improving the crosslink density of the curable resin composition.

In the present invention, as the polyfunctional polymerizable compound (c), a photopolymerizable compound having 2 or more photopolymerizing functional groups in the single molecule thereof, preferably 3 or more photopolymerizing functional groups therein is used. The reaction style of the polyfunctional polymerizable compound (c) is not restricted, and it may be any one of radical photopolymerization, cationic photopolymerization and anionic photopolymerization. The radical photopolymerizable compound is preferable since the compound can be photo-polymerized with the cyclic imide group represented by the formula (1), as well. A compound having 2 or more ethylenic unsaturated bonds in the single molecule thereof is particularly preferable. The polyfunctional polymerizable compound (c) maybe anyone of a monomer, an oligomer and a polymer having a relatively large molecular weight. In order to improve the crosslink density of the resin sufficiently in a relatively small amount, a monomer or an oligomer is preferably used.

As the compound having 2 or more ethylenic unsaturated bonds in the single molecule thereof, a polyfunctional acrylate monomer or oligomer is preferably used. Examples thereof include ethylene glycol (meth)acrylate, diethylene glycol di(meth)acrylate, propylene glycol di(meth)acrylate, dipropylene glycol di(meth)acrylate, polyethylene glycol di(meth)acrylate, polypropylene glycol di(meth)acrylate, hexane di(meth)acrylate, neopentyl glycol di(meth)acrylate, glycerin di(meth)acrylate, glycerin tri(meth)acrylate, glycerin tetra(meth)acrylate, tetratrimethylolpropane tri(meth) acrylate, 1,4-butanediol diacrylate, pentaerythritol triacrylate, trimethylolpropane triacrylate, pentaerythritol (meth) acrylate, and dipentaerythritol hexa (meth)acrylate. Two or more kinds of these components may be combined for use.

The polyfunctional polymerizable compound (c) preferably contains a monomer having 3 or more ethylenic unsaturated bonds, and the content by percentage thereof in the used polyfunctional polymerizable compound (c) is preferably from about 30 to 95% by weight.

The polyfunctional polymerizable compound (c) is preferably a compound having not only 2 or more ethylenic unsaturated bonds but also an alcoholic hydroxyl group. When the polyfunctional polymerizable compound (c) has an alcoholic hydroxyl group, the reactivity of the cyclic imide group in the curable resin (a) and the alcoholic hydroxyl group-containing polyfunctional polymerizable compound (c) is made high by hydrogen-pulling effect of the cyclic imide group of the curable resin (a) to the alcoholic hydroxyl group-containing polyfunctional polymerizable compound (c) when the curable resin composition is photo-cured. Thus, the sensitivity and the curability thereof can be improved.

Specific examples of the polyfunctional polymerizable compound (c) having an alcoholic hydroxyl group include 2-hydroxy-1-(meth)acryloxy-3-(meth)acryloxypropane, pentaerythritol di(meth)acrylate monostearate, tetramethylolmethane tri(meth)acrylate, pentaerythritol tri(meth)acrylate, dipentaerythritol hydroxypenta(meth)acrylate, epichlorohydrin-modified bisphenol A di(meth)acrylate, epichlorohydrin-modified diethylene glycol di(meth)acrylate, epichlorohydrin-modified 1,6-hexanediol di(meth)acrylate, and triglycerol di(meth)acrylate.

To the polyfunctional polymerizable compound (c), a monofuntional monomer as a reaction diluting agent can be added Examples of the monofuntional monomer include methyl (meth)acrylate, ethyl (meth)acrylate, propyl (meth) acrylate, butyl (meth)acrylate, pentyl (meth)acrylate, ethylhexyl (meth)acrylate, styrene, methylstyrene, and N-vinylpyrrolidone.

The content by percentage of the polyfunctional polymerizable compound (c) in the curable resin composition is usually set to 3 to 50% by weight, preferably 5 to 40% by weight as a solid content ratio. In the case of forming a spacer, the content is usually set to 3 to 90% by weight, preferably 5 to 85% by weight in order to obtain a sufficient elastic deformation modulus. If the content of the polyfunctional polymerizable compound is too small, there arises an inconvenience that various physical properties of the formed coating layer, such as adhesive strength and heat resistance, become insufficient. If the content of the polyfunctional polymerizable compound is large, there arise inconveniences that the stability of the curable resin composition deteriorates and the flexibility of the formed coating layer becomes insufficient. Furthermore, in order to improve the solubility of the formed coating layer in a developing solution, it is also necessary that the content falls within the above-mentioned range. If the content is out of the optimal range, the coating layer is developed into a pattern, However, since the monomer curing speed becomes large, a scum or a whisker may be generated in the vicinity of the pattern. When the content is out of the optimal range, resist re-adhesion may be generated on the basis of partial swelling or exfoliation if things come to the worst. Thus, the formation of a precise pattern may be hindered.

As the photopolymerization initiator, a radical photopolymerization initiator can be used. The radical photopolymerization initiator may be activated by ultraviolet rays, ionizing radiation rays, visible rays, or other energy rays having various wavelengths, particularly 365 μm or less. Since the cyclic imide group represented by the formula (1) has radical polymerization reactivity, a compound having radical polymerization reactivity is mainly used as the polyfunctional polymerizable compound (c) as well. In this case, a radical photopolymerization initiator is used. However, when the polyfunctional polymerizable compound (c) has a polymerization reaction style other than radical polymerization, a polymerization initiator corresponding to the reaction style of the compound (c) may be used.

The radical photopolymerization initiator is a compound which generates a free radical by irradiation energy of light, for example, ultraviolet ray, and examples thereof include benzophenone derivatives such as benzoin, and benzophenone, or derivatives such as esters thereof; xanthone and thioxanthone derivatives; halogen-containing compounds such as chlorosulfonyl, chloromethyl polynuclear aromatic compounds, chrloromethyl heterocyclic compounds, and chloromethyl benzophenone; triazines; fluorenones; haloalkanes; redox couples of a photo reducing pigment and a reducing agent; organic sulfur compounds; and peroxides. Preferable examples thereof include ketone-based and biimidazol-based compounds, such as Irgacure 184, Irgacure 369, Irgacure 651, Irgacure 907, and Darocure 1173 (produced by Chiba Specialty Chemicals Corp.), Adeka 1717 (produced by Asahi Denka Co., Ltd.), and 2,2'-bis(o-chlorophenyl)-4,5,4'-tetraphenyl-1,2'-biimidazol (produced by Kurogane Kasei Corp.). The initiators can be used alone or in a combination of two or more. In the case of using two or more, it is preferable that they do not hinder absorption spectrum characteristics.

The radical photopolymerization initiator is contained in the curable resin composition, in general, at a ratio of 0.05 to 18% by weight, preferably 0.1 to 13% by weight as a solid content ratio. If the additionamount of thephotopolymerization initiator is less than 0.05% by weight, the photo-curing reaction is not advanced so that the residual layer ratio, the heat resistance, and the chemical resistance tend to be lowered. On the other hand, if this addition amount is more than 18% by weight, the solubility into the base resin is saturated so that crystal of the initiator is precipitated at the time of spin coating or coating layer leveling so as not to maintain the homogeneity of the layer surface, and thus a problem of the generation of layer ruggedness is involved.

In preparing the curable resin composition, the photopolymerization initiator may be added initially to the above-mentioned curable resin (a) for photo-patterning. When the composition is stored for a relatively long term, it is preferable to disperse or dissolve the same in the curable resin composition immediately before use.

When improvement of the photosensitivity is required, a sensitizer may be added. As the sensitizer to be used, a styryl-based compound or a courmarin-based compound is preferable. Specific examples thereof include 2-(p-dimethylaminostyryl) quinoline, 2-(p-diethylaminostyryl)quinoline, 4-(p-dimethyl aminostyryl)quinoline, 4-(p-diethylaminostyryl) quinoline, 2-(p-dimethylaminostyryl)-3,3-3H-indol, 2-(p-diethylaminostyryl)-3,3-3H-indol, 2-(p-dimethylaminostyryl) benzoxazol, 2-(p-diethylaminostyryl)-benzoxazol, 2-(p-dimethylaminostyryl)benzimidazol, and 2-(p-diethylaminostyryl)-benzimidazol.

Moreover, examples of the courmarin-based compounds include 7-diethylamino-4-methylcourmarin, 7-ethylamino-4-trifluoromethylcourmarin, 4,6-diethylamino-7-ethylaminocourmarin, 3-(2-benzimidazolyl)-7-N,N-diethylaminocourmarin, 7-diethylaminocyclopenta (c) courmarin, 7-amino-4-trifluoromethylcourmarin, 1,2,3,4,5,3H,6H, 10H-tetrahydro-8-trifluoromethyl (1) benzopyrrano-(9,9a,1-gh)-quinolidine-10-one, 7-ethyl amino-6-methyl-4-trifluoromethylcourmarin, and 1,2,3,4,5,3H,6H,10H-tetrahydro-9-carbethoxy (1) benzopyrrano-(9,9a,1-gh)-quinolidine-10-one.

Furthermore, in the curable resin composition for photo-patterning according to the present invention, a compound having two or more epoxy groups in the molecule thereof (epoxy resin) can be included as needed to improve heat resistance, adhesion property, chemical resistance (in particular, the alkali resistance). Examples of the compound having two or more epoxy groups in the molecule thereof include bisphenol A type epoxy resins, such as Epi Coat 1001, 1002, 1003, 1004, 1007, 1009, and 1010 (produced by Japan Epoxy Resin), bisphenol F type epoxy resins, such as Epi Coat 807 (produced by Japan Epoxy Resin), phenol novolak type epoxy resins, such as EPPN 201, 202 (produced by Nihon Kayaku Co., Ltd.), and Epi Coat 154 (produced by Japan Epoxy Resin), and cresol novolak type epoxy resins, such as EOCN 102, 103S, 104S, 1020, 1025, 1027 (produced by Nihon Kayaku Co., Ltd.), and Epi Coat 180S (produced by Japan Epoxy Resin). Furthermore, cyclic aliphatic epoxy resins and aliphatic polyglycidyl ethers can also be given as examples.

Among these examples, the bisphenol A type epoxy resins, the bisphenol F type epoxy resins, the phenol novolak type epoxy resins, and the cresol novolak type epoxy resins are preferable. Although most of the compounds having two or more epoxy groups in the molecule thereof have a high molecular weight, the glycidyl ethers such as bisphenol A and bisphenol F have a low molecular weight. Those having such a low molecular weight are particularly preferable. Moreover, an acrylic copolymer including, as a copolymerization unit, glycidyl(meth)acrylate, oxetane(meth)acrylate, alicyclic epoxy(meth)acrylate, or the like in its resin skeleton is also effective.

The epoxy resin is contained in the photo-curable resin composition usually at a ratio of 0 to 60% by weight, preferably 5 to 40% by weight as a solid content ratio. If the epoxy resin content is less than 5% by weight, a sufficient alkali resistance may not be applied to the protect layer. In contrast, if the epoxy resin content is more than 60% by weight, the epoxy resin amount is too large so that the storage stability and the developing suitability of the photo-curable resin composition deteriorate, and thus this case is not preferable. Moreover, the epoxy resin is effective also for eliminating the tack of the dried coating layer of the curable resin composition, and a sufficient effect can be provided in an addition amount of about 3% by weight. The epoxy resin reacts with an acid functional group remaining, without any reaction even after exposure and alkaline development, in the coating layer by heat treatment so as to provide excellent alkali resistance to the coating layer.

If necessary, various additives such as a surfactant and a silane coupling agent, besides the above-mentioned components, may be added to the above-mentioned curable rein composition.

When the curable resin composition for photo-patterning is used to form a color layer of a color filter, a coloring agent such as a pigment or a dye is incorporated into the curable resin composition. As the coloring agent, a coloring agent which has such a heat resistance that can resist a heating process for the color filter and is made of fine particles which can be satisfactorily dispersed is selected from organic or inorganic coloring agents, so as to match with a desired color (such as R, G or B) of the color layer.

As the organic coloring agent, for example, a dye, an organic pigment, or a natural dye can be used. As the inorganic coloring agent, for example, an inorganic pigment or an extender pigment can be used.

Specific examples of the organic pigment include compounds classified into pigments in the Color Index (C.I., published by the Society of Dyes and Colourists Co.), that is, compounds to which a color index (C.I.) number as described in the following is attached: Yellow Pigments such as C.I. Pigment Yellow 1, C.I. Pigment Yellow 3, C.I. Pigment Yellow 12, C.I. Pigment Yellow 13, C.I. Pigment Yellow 138, C.I. Pigment Yellow 150, C.I. Pigment Yellow 180, and C.I. Pigment Yellow 185; Red Pigments such as C.I. Pigment Red 1, C.I. Pigment Red 2, C.I. Pigment Red 3, C.I. Pigment Red 254, and C.I. Pigment Red 177; Blue Pigments such as C.I. Pigment Blue 15, C.I. Pigment Blue 15:3, C.I. Pigment Blue 15:4, and C.I. Pigment Blue 15:6; C.I. Pigment Violet 23:19; C.I. Pigment Green 36; and so on.

Specific examples of the inorganic pigment and the extender pigment include titanium oxide, barium sulfate, calcium carbonate, zinc white, lead sulfate, yellow lead, zinc yellow, red iron oxide (read iron oxide (III)), cadmium red, ultramarine blue, iron blue, chromium oxide green, cobalt blue, umber, titanium black, synthetic iron black, and carbon black. In the present invention, the coloring agents may be used alone or in combination of two or more.

The coloring agent is incorporated into the curable resin composition for photo-patterning of the present invention usually at a ratio of 40 to 75% by weight, preferably 45 to 70% by weight. If the incorporation ratio of the coloring agent is below the above-mentioned range, the colorability of the respective color layers is insufficient so that a vivid image is not easily displayed. On the other hand, if the incorporation ratio is over the above-mentioned range, inconveniences such that the light transmittance of the respective color layers is insufficient are caused.

When the coloring agent is incorporated into the curable resin composition, a dispersing agent may be incorporated into this composition to disperse the coloring agent evenly and stably. Examples of the dispersing agent that can be used include cationic, anionic, nonionic, amphoteric, silicone-based or fluorine-containing surfactants. Among the surfactants, a high molecular surfactant (high molecular dispersing agent) is preferable.

Examples thereof include polyoxyethylene alkyl ethers such as polyoxyethylene lauryl ether, polyoxyethylene steary ether, and polyoxyethylene oleyl ether; polyoxyethylene alkylphenyl ethers such as polyoxyethylene octylphenyl ether, and polyoxyethylene nonylphenyl ether; polyethylene glycol diesters such as polyethylene glycol dilaurate and polyethylene glycol distearate; sorbitan aliphatic acid esters; aliphatic acid modified polyesters; tertiary amine modified polyurethanes.

The curable resin composition for photo-patterning of the present invention in general contains a solvent which has a good solubility for dissolving the imide-containing copolymer, the polyfunctional thiol compound, the polyfunctional polymerizable compound, the photopolymerization initiator and so on, and has a relatively high boiling point to make spin coating property good, considering preparation of a paint and the coating suitability.

Examples of the solvent that can be used include organic solvents including alcohol-based solvents such as methyl alcohol, ethyl alcohol, N-propyl alcohol, and i-propyl alcohol; cellosolve-based solvents such as methoxy alcohol, and ethoxy alcohol; carbitol-based solvents such as methoxy ethoxy ethanol, and ethoxy ethoxy ethanol; ester-based solvents such as ethyl acetate, butyl acetate, methyl methoxypropionate, ethyl ethoxypropionate, and ethyl lactate; ketone-based solvents such as acetone, methyl isobutyl ketone, and cyclohexanone; cellosolve acetate-based solvents such as methoxyethyl acetate, ethoxyethyl acetate, and ethylcellosolve acetate; carbitol acetate-based solvents such as methoxyethoxyethyl acetate, and ethoxyethoxyethyl acetate; ether-based solvents such as diethyl ether, ethylene glycol dimethyl ether, diethylene glycol dimethyl ether, and tetrahydrofuran; non-protonicamido solvents such as N,N-dimethylformamido, N,N-dimethylacetoamido, and N-methylpyrrolidone; lactone-based solvents such as γ-butylolactone; unsaturated hydrocarbon-based solvents such as benzene, toluene, xylene, and naphthalene; and saturated hydrocarbon-based solvents such as N-heptane, N-hexane, and N-octane.

Among these solvents, cellosolve acetate-based solvents such as methoxyethyl acetate, ethoxyethyl acetate, and ethylcellosolve acetate; carbitol acetate-based solvents such as methoxyethoxy ethyl acetate, and ethoxyethoxy ethyl acetate; ether-based solvents such as ethylene glycol dimethyl ether, diethylene glycol dimethyl ether, and propylene glycol diethyl ether; and ester-based solvents such as methyl methoxypropionate, ethyl ethoxypropionate, and ethyl lactate can be particularly preferably used. Particularly preferably, MBA (3-methoxybutyl acetate, $CH_3CH(OCH_3)CH_2CH_2OCOCH_3$), PGMEA (propylene glycol monomethyl ether acetate, $CH_3OCH_2CH(CH_3)OCOCH_3$), DMDG (diethylene glycol dimethyl ether, $H_3COC_2H_4OCH_3$), or a mixture thereof. The solid content concentration is adjusted to usually 5 to 50% by weight, using these solvents.

In order to produce the curable resin composition for photo-patterning of the present invention, the curable resin (a), the polyfunctional thiol compound (b), the polyfunctional polymerizable compound (c), the photopolymerization initiator, and other components are put into a suitable solvent, and these components are dissolved or dispersed in the solvent by an ordinary method using a paint shaker, a bead mill, sand grind mill, a ball mill, an attriter mill, a two-roll mill, a three-roll mill, or the like. As the curable resin, which is a main polymer, there may be used a resin obtained by isolating or purifying the imide-containing copolymer as an effective component after synthesis reaction thereof, or a reactant solution or a dried product obtained by synthesis reaction thereof as it is.

When the thus-obtained curable resin composition is applied to some substrate to form a coating layer and then the coating layer is irradiated with activating energy rays such as ultraviolet rays or ionizing radiation rays, the photopolymerizing functional group or the cyclic imide groups of the curable resin (a) for photo-patterning, the mercapto group of the polyfunctional thiol compound (b), and the polyfunctional polymerizable compound (c) such as an acrylic monomer having two or more functional groups undergo radical photopolymerization reaction and further the cyclic imide groups undergo dimerization reaction. In this way, crosslinks are formed between the molecules of the curable resin (a) for photo-patterning and then the resin is cured. In this photo-curing reaction, the cyclic imide groups themselves, in the curable resin (a) for photo-patterning, undergo crosslinking reaction. Simultaneously, the imide groups pull out hydrogen from the mercapto group in the polyfunctional thiol compound (b), to generate a radical, thereby improving the sensitivity of the resin composition.

Particularly when the photopolymerizing group-containing unit of the curable resin (a) for photo-patterning and the polyfunctional polymerizable compound (c) have a radical photopolymerizing group such as an ethylenic unsaturated bond, crosslinks are formed also between the cyclic imide group and these constitutional units or compounds thereby contributing to an improvement in physical properties of the cured composition. Thus, superiority in physical properties, such as elastic deformation modulus, total deformation modulus, hardness, strength, heat resistance and adhesiveness, is easily obtained.

In this curable resin composition, the photopolymerizing functional group and the cyclic imide group coexist as crosslinking groups in the molecule of the imide-containing copolymer, which is the curable resin (a) for photo-patterning. On the basis that the reactivity of the cyclic imide group is high and that the reaction point density of crosslinking reaction is high, a very high exposure sensitivity can be made only by using a small amount of the photopolymerization initiator. Moreover, the composition can be cured at a little exposure amount or in a very short exposure time. Accordingly, the time for curing the composition can be shortened and further energy for the exposure and the use amount of the photopolymerization initiator can be saved.

After the composition is cured, the thermal discoloration resistance of the cured product is superior on the basis of both of the matter that the use amount of the photopolymerization initiator is mall and the action of the polyfunctional thiol compound (b). Particularly when the cured product is used as a protect layer or a color layer of a color filter, yellowing is not easily generated through a heating process and the transparency thereof is superior. Furthermore, this curable resin composition is superior in various physical properties such as coating layer strength, heat resistance and chemical resistance, after the composition is cured since the cyclic imide group is concerned with the crosslinking reaction and the reaction point density of the crosslinking reaction is high.

When the molecule of the imide-containing copolymer, which is the curable resin (a) for photo-patterning, or the polyfunctional polymerizable compound (c) contains an alcoholic hydroxyl group, a radical is generated by the hydrogen pulling-out effect of the imide group to the alcoholic hydroxyl group-containing methylene group or methine group. Therefore, the reactivity of the crosslinking reaction becomes higher and the exposure sensitivity and curability of the composition are improved.

In the present invention, the exposure sensitivity of a photo-curable resin composition can be evaluated by the following method. First, a photo-curable resin composition is applied on a substrate and dried as needed to form a coating layer. As the substrate, any plate can be used without problems if it does not interfere with a course of the pattern forming process of exposure, developing and others. An example thereof is a transparent glass plate. The thickness of the coating layer is not especially limited, but normally it should be set to about 1 to 10 µm. This coating layer is pre-baked under proper conditions, for example, at a temperature of 70 to 150° C. for 1 to 10 minutes. After the pre-baking, the coating layer is exposed at a known exposure strength and then its thickness is measured. The thickness measured at this stage is referred to as "the layer thickness before development".

Next, the pre-baked coating layer is caused to contact a proper developer to dissolve and remove unexposed parts. The remaining exposed part is washed if necessary, so as to develop the coating layer. Here, the composition of the developer and the developing conditions should be suitably selected depending on a photo-curable resin composition to be tested. It is needless to say that a preferable developer is such a developer that the exposed part (the cured part) of the photo-curable resin composition is hardly dissolved and the unexposed part is completely dissolved. The developed coating layer is post-baked under proper conditions, for example, at a temperature of 180 to 280° C. for 20 to 80 minutes. After the post-baking, the thickness of the coating layer is measured, and the thickness is referred to as "the final layer thickness after curing".

From the layer thickness before development and the final layer thickness after curing, which are measured as described above, the residual layer rate is calculated according to the following equation:

Residual layer rate (%)={(final layer thickness after curing (µm))÷(layer thickness before development (µm))}×100.

On the other hand, the same photo-curable resin composition is applied onto a substrate, dried, and pre-baked in the same way as mentioned above to form a coating layer for reference. This coating layer for reference is exposed at exposure strength that is sufficient to completely cure the coating layer, and then its layer thickness is measured. The layer thickness measured at this stage is referred to as "the completely exposed layer thickness". Next, the coating layer that has been completely exposed is post-baked without developing by the same method as used for the sample layer, and then the layer thickness of the obtained film is measured by the same method as mentioned above. The layer thickness is referred to as "the final layer thickness without the developing process". From the completely exposed layer thickness and the final layer thickness without the developing process that are measured as described above, the reference residual layer rate is calculated according to the following equation:

Reference residual layer rate(%)={(final layer thickness without the developing process (µm))÷(completely exposed layer thickness (µm))}×100.

After calculating the residual layer rate and reference residual layer rate in this way, the smallest exposure amount in case where the residual layer rate is equal to the reference residual layer rate provided that the error limit is 1% is defined as the minimum exposure amount of the photo-curable resin composition. It can be evaluated that the smaller the minimum exposure amount is, the higher the sensitivity is.

According to the present invention, it is possible to obtain such a very high sensitivity photo-curable resin composition that the minimum exposure amount, which is determined in this way, is 100 mJ/cm$^2$ or less, preferably 50 mJ/cm$^2$ or less, and more preferably 35 mJ/cm$^2$ or less, and still more preferably 25 mJ/cm$^2$ or less.

The curable resin composition for photo-patterning of the present invention is particularly suitable for forming a color layer of a color filter, a protect layer for covering the color layer, and a convex spacer for maintaining a cell gap of a liquid crystal panel substrate. Besides, the composition can be suitably used as a material for forming a negative type permanent layer or film in broad fields, for example, a flattening layer of a TFT array substrate and an interlayer insulating layer for semiconductor devices.

The color filter of the present invention comprises a transparent substrate, and a color layer disposed on the transparent substrate, and may further comprise a protect layer for covering the color layer and/or a spacer disposed in a non-display region of the substrate, wherein at least one of the color layer, the protect layer and the spacer is formed by curing the above-mentioned curable resin composition for photo-patterning according to the present invention.

In the liquid crystal panel substrate according to the present invention, plural spacers are disposed in a non-display region on a substrate, the spacers are formed by curing the above-mentioned curable resin composition for photo-patterning according to the present invention, and the elastic deformation modulus "(elastic deformation quantity/total deformation quantity)×100" of the spacers is 60% or more against a compressive load of 2.0 GPa at room temperature. The liquid crystal panel substrate having such spacers may be the above-mentioned color filter, which is a display side substrate, or a liquid crystal driving side substrate.

Figure 3:
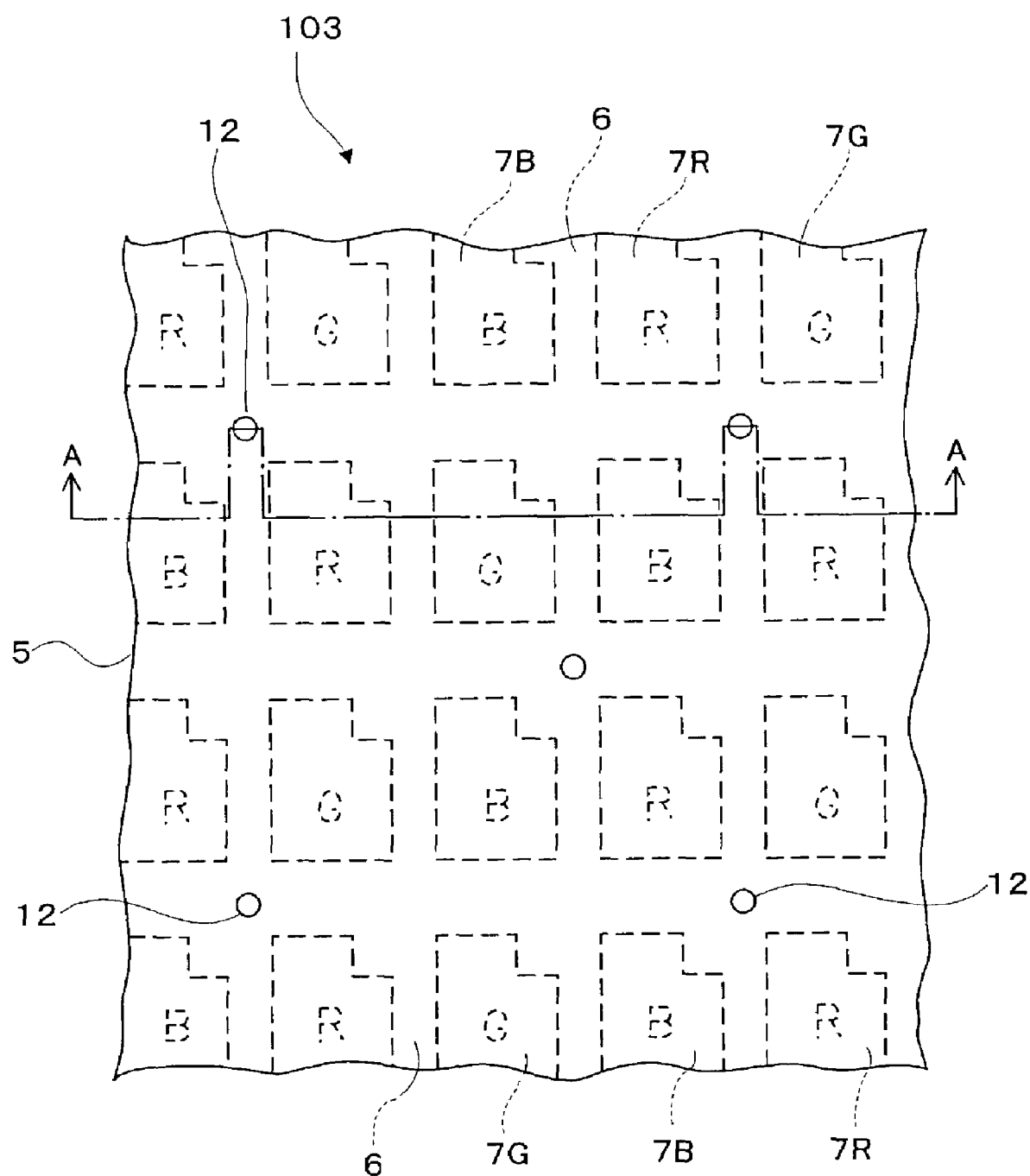
FIG. 3 is a plan view of one example of the liquid crystal panel substrate according to the present invention.
Figure 4:
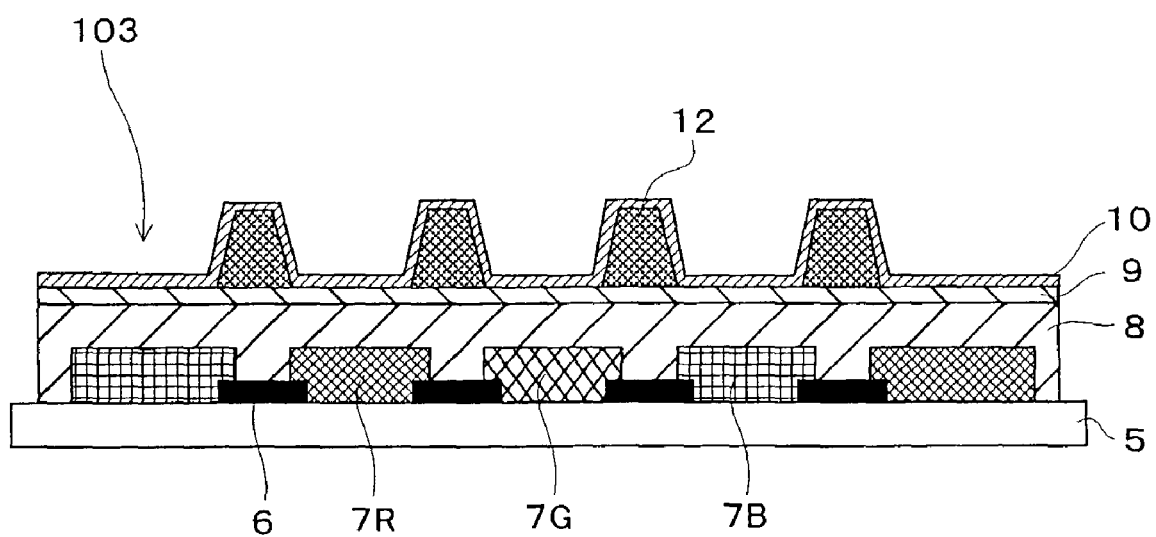
FIG. 4 is a sectional view of the example of the liquid crystal panel substrate according to the present invention; and, FIG. 5 is a graph showing a relationship between a load and the deformation quantity of a convex spacer.

FIG. 3 is a plan view illustrating an example of a color filter (color filter 103) which belongs to the liquid crystal panel substrate according to the present invention, and FIG. 4 is a vertical sectional view of the color filter 103 taken along A-A line.

This color filter 103 has a black matrix 6 formed into a given pattern on a transparent substrate 5, a color layer 7 (7R, 7G and 7B) formed into a given pattern on the black matrix, and a protect layer 8 formed to cover the color layer. A transparent electrode 9 for driving a liquid crystal may be formed on the protect layer if necessary. An oriented layer 10 is formed on the innermost face of the color filter 103 (on the transparent electrode in this example).

Column-shaped spacers 12 are one kind of convex spacers, and are formed at plural positions (5 positions in FIG. 3) on the transparent electrode 9 to match with a region where the black matrix layer 6 is formed (namely, non-display region). The column-shaped spacers 12 are formed on the transparent electrode 9, the color layer 7, or the protect layer 8. In the color filter 103, the column-shaped spacers are formed on the protect layer 8 via the transparent electrode 9 so as to be interspersed across a plane direction like islands in a sea. The protect layer 8 and the column-shaped spacers 12 may be formed to be integrated with each other, and a layer of the transparent electrode may be formed to cover the integration. When the color filter has no black matrix layer, the column-shaped spacers can be formed in the region where no color layer is formed.

As the transparent substrate 5 of the color filter 103, there may be used a nonflexible, transparent and rigid material such as quartz glass, Pyrex (registered trade name) glass or a synthetic quartz plate, or a transparent flexible material having flexibility, such as a transparent resin film or an optical resin plate. Particularly, 1737 glass made by Corning Co. is a material which has a small thermal expansion coefficient and is superior in dimensional stability and workability in high-temperature heating treatment, and is non-alkali glass containing no alkali component therein; therefore, it is suitable for a color filter in a color liquid crystal display device of an active matrix system.

In order to improve the contrast of a display image, the black matrix layer 6 is disposed at boundaries of the each color layer pieces 7R, 7G and 7B and is also disposed to surround the outside of the color layer formed region. As the method for forming the black matrix layer 6, the following two methods are known: a method of using a photosensitive resist, and a method of using a curable resin composition containing light-shading particles.

In the method of using a photosensitive resist, firstly, a thin film of a metal (such as chromium) or a resin layer is formed as a shading layer on the transparent substrate 5, in which the metal thin film is formed by gaseous phase growth method such as sputtering or vacuum evaporation, and the resin layer is made from a resin composition comprising a resin (such as polyimide resin, acrylic resin or epoxy resistance) and light-shading particles (such as carbon black particles) by a coating method, such as spin coating, roll coating, spraying, or printing. Onto the thus-obtained shading layer made of the metal thin film or the shading resin, a known positive or negative photosensitive resist is applied, so as to form a photosensitive resist layer. The resist layer is exposed to light through a photo mask having a pattern for a black matrix and then developed. The shading layer in the portion naked by the development is etched and then the remaining photosensitive resist is removed, whereby the black matrix layer 6 can be formed.

In the method of using a curable resin composition containing light-shading particles, firstly, the curable resin composition containing light-shading particles such as carbon black or metal oxide particles is applied onto the transparent substrate 5 and optionally dried to form a photosensitive coating layer, and then this coating layer is exposed to light through a mask for a black matrix, developed and optionally subjected to heat treatment, whereby the black matrix layer 6 can be formed. As the curable resin composition blended with the light-shading particles, the curable resin composition according to the present invention may be used.

The thickness of the black matrix layer is set to about 1000 to 2000 Å in the case of the metal thin film, and is set to about 0.5 to 2.5 μm in the case of the shading resin layer.

The color layer has a red pattern, a green pattern and a blue pattern disposed in a desired form, such as a mosaic form, a stripe from, a triangular form, and a four-pixel arrangement form, so as to form a display region. The color layer can be formed by a known method such as a pigment dispersion method, a dyeing method, a printing method, or an electrode positing method. Among these methods, the pigment dispersion method, wherein a curable resin composition containing a coloring agent such as a pigment is used, is preferable.

In the case of the pigment dispersion method, coloring agents such as pigments are first dispersed into a curable resin composition to prepare photo-curable colored resin compositions for red, green and blue separately. Next, any one of the photo-curable colored resin compositions, for example, the photo-curable red resin composition is applied onto the transparent substrate 5 to cover the black matrix layer 6 by a known method such as spin coating, so as to form a photo-curable red resin layer. This layer is exposed to light through a photo mask for a red pattern, alkali-developed, and then cured by heating in a clean oven, to form the red color layer 7R. Thereafter, the photo-curable colored resin compositions for green and blue are successively used to pattern the respective color resin layers in the same way. In this way, the green color layer 7G and the blue color layer 7B are formed.

As the coloring agent, a coloring agent as described above is appropriately selected and used. It is preferable to use the curable resin composition according to the present invention as the curable resin composition blended with the coloring agent.

The thickness of the color layer is usually set to about 0.5 to 2.5 µm. It is allowable that the color layers in the respective colors are varied in thickness and a liquid crystal layer thickness optimal for each of the colors is set, for example, so that the red color layer 7R is thickest, the green color layer 7G is the second thickest and the blue color layer 7B is thinnest.

The protect layer 8 is disposed to flatten the surface of the color filter and further prevent components contained in the color layer from eluting out in the liquid crystal layer. The protect layer 8 can be formed by applying a known negative photo-curable transparent resin composition or thermosetting transparent resin composition onto the black matrix layer 6 and the color layer 7 by spin coating, roll coating, spraying, printing, or the like to cover the layers 6 and 7, and then curing the composition by light or heat. The photo-curable transparent resin composition used to form the protect layer is preferably the curable resin composition according to the present invention.

The thickness of the protect layer is set, considering the light transmittance of the resin composition, the surface state of the color filter, and so on. For example, the thickness is set to about 0.1 to 2.0 µm. In the case of using a spin coater, the rotation number thereof is set within the range of 500 to 1500 rotations/minute.

The transparent electrode 9 on the protect layer is formed by a common method, such as sputtering, vacuum evaporation, and CVD, using tin indium oxide (ITO), zinc oxide (ZnO), tin oxide (SnO), or an alloy thereof, and has a given pattern formed by etching with a photo resist or use of a tool as needed. The thickness of the transparent electrode can be set to about 20 to 500 nm, preferably about 100 to 300 nm.

The convex spacers are arranged in the non-display region on the substrate in order to maintain a cell gap when the color filter 103 is adhered to a liquid crystal driving side substrate such as a TFT array substrate. The shape and the size of the convex spacers are not particularly limited if the spacers can be selectively arranged in the non-display region on the substrate and the given cell gap can be maintained over the whole of the substrate. When the column-shaped spacers 12 as illustrated are formed as the convex spacers, the spacers 12 have a constant height within the range of about 2 to 10 µm. The projection height (thickness of the pattern) can be appropriately set, considering the thickness required for the liquid crystal layer, and others. The width of the spacers 12 can be appropriately set within the range of about 5 to 20 µm. The density (crowd degree) of the formed column-shaped spacers 12 can be appropriately set, considering the thickness evenness of the liquid crystal layer, the numerical aperture thereof, the shape of the column-shaped spacers, the material thereof, and so on. The density may be set in such a manner that one of the spacers is formed per one group of respective pixels in red, green and blue, whereby exhibiting a necessary and sufficient spacer function. It is sufficient that the shape of such spacers is column-shaped. For example, the shape may be a columnar, polygonally columnar, head-cut conical, or the like shape.

The convex spacers of the liquid crystal panel substrate according to the present invention, a typical example of which is the color filter 103, are products obtained by curing-reaction of the resin composition according to the present invention as a binder polymer. In the present invention, the convex spacer can have the elastic deformation modulus "(elastic deformation quantity/total deformation quantity)×100" of the spacers being 60% or more, preferably 70% or more, and more preferably 80% or more against a compressive load of 2.0 GPa at room temperature.

In the present invention, the wording "room temperature" means any environmental temperature encountered in dairy life. The range thereof is indefinite but includes at least the temperature range of 1 to 35° C.

Figure 5:
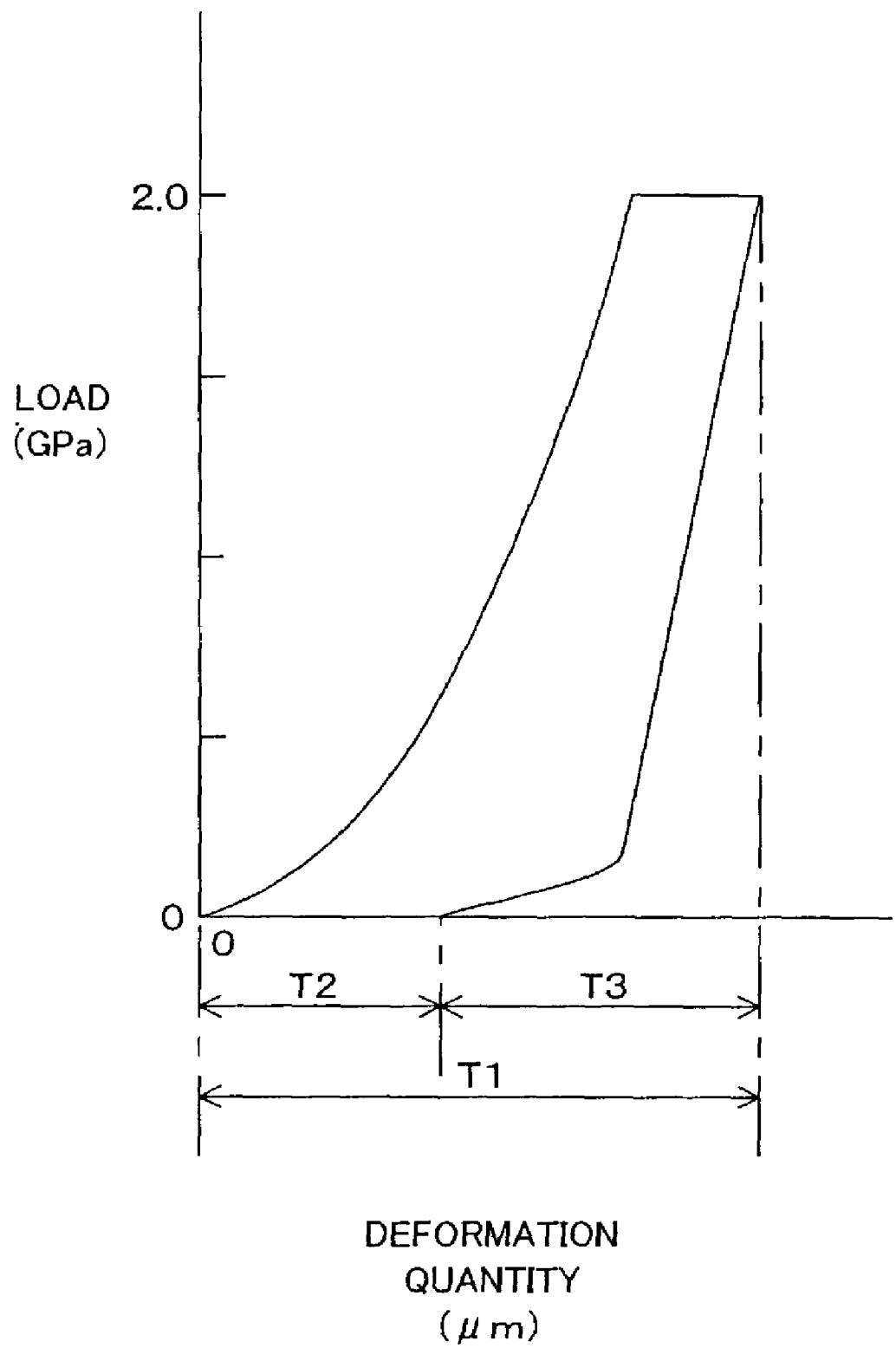

The elastic deformation modulus of the convex spacers can be measured by a method as described in the following. A device that can be used to measure the deformation quantity of the convex spacers when a load is applied to the spacers is Fischer Scope H-100 (using a Vickers indenter (in a quadrangular pyramid form) whose head is polished to have a plane having a size of 100 µm×100 µm), made by Fischer Instruments K.K. This device was used to compress a convex spacer having a height of T and then the load was released. FIG. 5 shows the behavior of the convex spacer in this process releasing the load, and relationship among the total deformation quantity (T1), the plastic deformation quantity (T2) and the elastic deformation quantity (T3).

The color filter 103 or another liquid crystal panel substrate according to the present invention is first allowed to be left at room temperature and then the above-mentioned device is used to bring the indenter into contact with the top portion of the above-mentioned spacer and pushed onto the top portion so as to apply a load toward the height direction of the convex spacer (the thickness direction of the layer) while the load is increased at a rate of 22 MPa/second. When the compressive load reaches 2.0 GPa, the load is kept for 5 seconds and the total deformation quantity (T1) of the convex spacer is measured. Next, by raising up the intender pushed onto the convex spacer, the load is removed at a rate of 22 MPa/second. When the compressive load is returned to zero, the remaining deformation quantity, that is, the plastic deformation quantity (T2) is measured. By subtracting the plastic deformation quantity (T2) from the total deformation quantity (T1), the deformation quantity restored immediately after the release of the load, that is, the elastic deformation quantity (T3) is calculated. By substituting the thus-obtained values of the total deformation quantity (T1) and the elastic deformation quantity (T3) for the equation of "(elastic deformation quantity (T3)/total deformation quantity (T1))×100", the elastic deformation modulus (%) can be obtained.

When the elastic deformation modulus of the convex spacer at room temperature is less than 60%, the spacer undergoes plastic deformation easily at room temperature so that the spacer does not fulfill its original function, which is the function of maintaining a precise and even cell gap, sufficiently. Specifically, in this case, troubles as described in the following are caused: when a color filter and a liquid crystal driving side substrate are combined by a room-temperature cell pressure adhesion method, pressure unevenness cannot be relieved or absorbed so that gap unevenness is easily generated; when external force such as impact or pressing force is applied to the fabricated liquid crystal panel, the panel is kept in a distorted state and is apt not to be restored to its original state; or the spacer cannot follow thermal contraction and expansion of the liquid crystal within a wide temperature range including room temperature, so that foams are easily generated in the liquid crystal layer.

In the present invention, it is preferable that the elastic deformation modulus of the convex spacer is 60% or more against a compressive load of 2.0 GPa at room temperature and further the total deformation modulus "=(total deformation quantity (T1)/height of the spacer (T)×100)" is 80% or less. If the total deformation modulus is more than 80%, at the time of cell pressure adhesion process, the color filter and the liquid crystal driving side substrate contact each other so that the color filter or the liquid crystal driving side substrate is injured. As a result, display unevenness may be generated.

The convex spacer satisfying the above-mentioned physical properties can be formed using the curable resin composition according to the present invention. That is, a coating liquid of the curable resin composition according to the present invention is first applied, directly or across another layer such as a transparent electrode layer, onto a transparent substrate by spin coating, roll coating, spraying, printing or the like method, and then dried to form a photo-curable resin layer. It is advisable that the rotation number of a spin coater is set within the range of 500 to 1500 rotations/minute in the same manner as in the case of forming a protect layer. Next, this resin layer is exposed through a photo mask for a convex spacer to light, and then developed with a developer such as an alkali solution, so as to form a given convex pattern. If necessary, this convex pattern is subjected to heat treatment (post-baking) in a clean oven, to form the above-mentioned convex spacer.

The convex spacer may be disposed directly or indirectly (across another layer) on a color filter. For example, it is allowable to form a transparent electrode such as ITO or a protect layer on a color filter and form a convex spacer thereon, or form a protect layer and a transparent electrode, in this order, on a color filter and then form a convex spacer on the transparent electrode.

Figure 2:
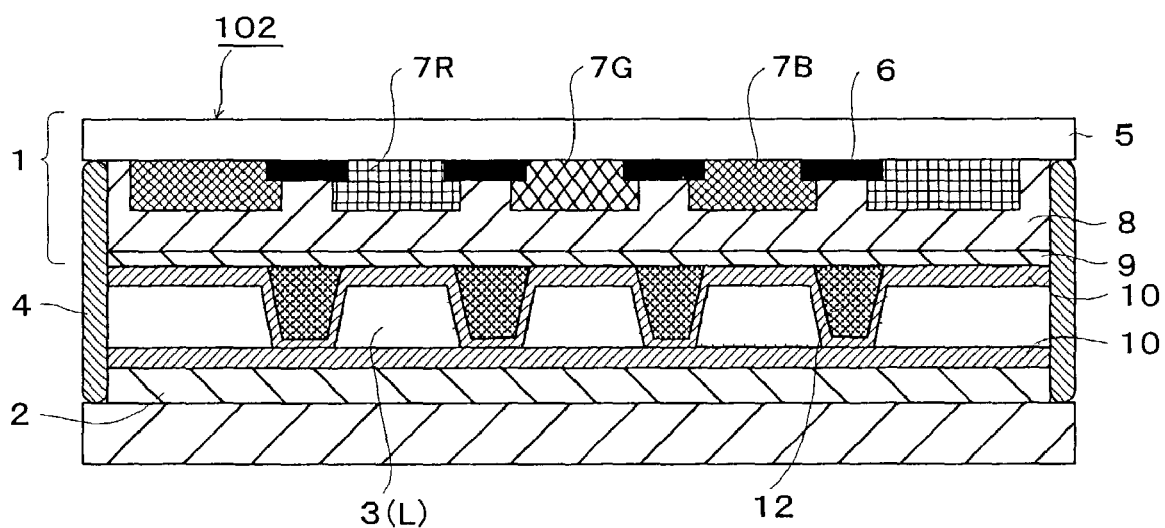
FIG. 2 is a schematic sectional view of another example of conventional liquid crystal panels.

Turning to FIG. 2, the oriented layer 10 is formed on the inner side of the color filter to cover a display region having the color layer or a non-display region having the black matrix layer 6 and the column-shaped spacers 12. The oriented layer can be formed by applying a coating liquid containing a resin such as polyimide resin by a known method such as spin coating, drying, optionally curing the resultant layer by heat or light, and rubbing the same.

The thus-obtained color filter 103 (display side substrate) and the TFT array substrate (liquid crystal driving side substrate) are faced with each other and then inner face side periphery portions of the two substrates are jointed with each other with a sealing agent so that the two substrates are adhered to each other in the state that a cell gap having a given interval is kept. By filling a liquid crystal into the gap portion between the substrates and sealing up the gap portion, a color liquid crystal display device in an active matrix system, which belongs to the liquid crystal panel according to the present invention, can be yielded.

In order to adhere the liquid crystal panel substrate according to the present invention, a typical example of which is the color filter 103, to a partner substrate, it is preferable to use the room-temperature cell pressure adhesion method. In any conventional cell fabricating process for producing a liquid crystal panel, it is common to adhere a color filter substrate onto an array substrate on which spacer beads are scattered or adhere an array substrate onto a color filter substrate on which spacer beads are scattered, under pressure, with a thermosetting agent such as an epoxy setting agent at high temperature, and then pour/confine a liquid crystal between the substrates in vacuum.

According to this method, however, a drop in production speed or yield is easily caused since the number of processes of fabricating the panel is large. In the case of a middle-sized or small-sized liquid crystal panel, the number of pixels thereof is small and thus the driving capacity thereof is also small. Consequently, it is sufficient that driving drivers are mounted onto three sides of the panel. Thus, the liquid crystal can be poured from the remaining side. On the other hand, in the case of a large-sized liquid crystal panel having fine displaying performance, the number of its pixels is large so that a large driving capacity is needed. For this reason, driver-mounting areas are necessary for four sides of the panel. Thus, when a liquid crystal is poured therein, the reliability of the panel is easily lowered by pollution of the liquid crystal when the driver-mounting areas contact the liquid crystal.

The ODF (One Drop Fill) technology is a technology of adding a liquid crystal dropwise to a substrate and adhering an opposite substrate to the substrate at a time in the state that a given cap gap is kept. In the prior art, it was difficult to apply the ODF technology to industry because of problems of the unevenness of the cell gap based on spacer beads, a lack in adhesive strength of a sealing agent, liquid crystal pollution and so on. In recent years, however, the ODF technology has been expected to be applied to industrial production in light of development situation of convex spacers, an improvement in the reliability thereof, development situation of photo-curing sealing material having a good adhesiveness. Since the convex spacer provided by the present invention has a superior elastic deformation modulus at room temperature and a high cell gap precision, it can also be used suitably for the case that room-temperature cell pressure adhesion is performed in the ODF technology.

The liquid crystal panel substrate according to the present invention has a spacer which is elastically deformed moderately at room temperature against a compressive load; therefore, when the substrate is adhered by the room-temperature cell pressure adhesion, the load is made even over the whole of the substrate by relief or absorption of pressure unevenness, so that the generation of gap unevenness is prevented. Additionally, the height of the spacer can be substantially completely restored to its original height after the compressive load is released. Thus, the cell gap of the liquid crystal panel substrate can be kept to have a given interval.

Even if the completed liquid crystal panel is temporarily distorted when external force such as impact or pressing form is applied thereto, the cell gap is restored to its original state. Therefore, display unevenness can be prevented. Furthermore, the panel can follow thermal contraction and expansion of the liquid crystal within a wide temperature range including room temperature. For this reason, the generation of foams in the liquid crystal layer can also be prevented.

Consequently, the liquid crystal panel according to the present invention does not cause any display unevenness easily, so as to exhibit superior image quality.

The above has described the liquid crystal panel substrate of the present invention, giving color filters as examples. However, the present invention can be applied to a display side substrate other than color filters, for example, a monochromic filter. The present invention can also be applied to a liquid crystal driving side substrate, such as a TFT array substrate or a driving substrate in a simple matrix system. When the present invention is applied to a liquid crystal driving side substrate such as a TFT array substrate, spacers on the liquid crystal driving side substrate are arranged inside a region which overlaps with a black matrix layer (non-display region) in a display side substrate to be combined.

As described above, the curable resin for photo-patterning provided by the present invention is a resin comprising an imide-containing copolymer having a molecular structure wherein the following are connected: a constitutional unit having a cyclic imide group represented by the above-mentioned formula (1), a constitutional unit having an acid functional group and a constitutional unit having a photopolymerizing functional group.

The curable resin composition for photo-patterning provided by the present invention is a composition which comprises, an essential component, the above-mentioned curable resin (a) for photo-patterning, and which may optionally comprise a polyfunctional thiol compound (b), a polymerizable compound (c) having 2 or more photopolymerizing functional groups and a photopolymerization initiator.

In the curable resin composition for photo-patterning of the present invention, the photopolymerizing functional group and the cyclic imide group coexist as the crosslinking functional groups in the molecule of the imide-containing copolymer, which is the curable resin (a) for photo-patterning. Because the cyclic imide group has a high reactivity and the reaction point density of crosslinking reaction is high, the resin composition can exhibit a very high exposure sensitivity only by using a small amount of the photopolymerization initiator. Moreover, the resin composition can be cured at a little exposure amount or in a very short exposure time. Accordingly, a time necessary for patterning can be shortened and energy for the exposure and the use amount of the photopolymerization initiator can be saved.

Since the use amount of the photopolymerization initiator is small, yellowing of the cured product, particularly yellowing when it is used as a protect layer or a color layer of a color filter, is not easily generated after the curing, thus providing superior transparency. The curable resin composition for photo-patterning is superior in various physical properties, such as coating layer strength, heat resistance and chemical resistance, after being cured since the cyclic imide group is concerned with crosslinking reaction and the reaction point density of the crosslinking reaction is high in the curable resin composition.

When the curable resin composition contains the polyfunctional thiol compound (b) together with the curable resin (a) for photo-patterning and it is photo-cured, the polyfunctional thiol compound (b) has an effect of improving reactivity of the cyclic imide group and the ethylenic unsaturated bond which are contained in the imide-containing copolymer (a) In other words, the cyclic imide group pulls out hydrogen of the mercapto group in the polyfunctional thiol compound (b) to generate a radical; therefore, by combining the polyfunctional thiol compound (b) with the curable resin (a) for photo-patterning, a curable resin composition having a very high sensitivity can be obtained.

The polyfunctional thiol compound (b) also has an effect of improving thermal discoloration resistance of the curable resin composition. Thus, by combining this with the curable resin (a) for photo-patterning, the thermal discoloration resistance is more improved. It is therefore possible to obtain a curable resin composition and a coating layer which are superior in thermal discoloration resistance and do not cause discolorations, such as yellowing.

Furthermore, when an alcoholic hydroxyl group is contained in the molecule of the curable resin (a) for photo-patterning or the polyfunctional polymerizable compound (c), the cyclic imide group pulls out hydrogen from the methylene group or the methine group which has the alcoholic hydroxyl group, to generate a radical. Therefore, the reactivity of the crosslinking reaction is more improved and the exposure sensitivity and the curability are improved.

The curable resin composition for photo-patterning of the present invention is suitable for a coating material for forming a color layer of a color filter, a protect layer for covering the color layer and a spacer for maintaining a cell gap in a liquid crystal panel. Namely, when the curable resin composition for photo-patterning of the present invention is used, it is possible to form a color layer, a protect layer and a column-shaped spacer which have a high productivity based on a high sensitivity and are superior in evenness and dimensional stability based on superior coating ability. Moreover, requirement of transparency necessary for the color layer and the protect layer can also be satisfied.

The liquid crystal panel according to the present invention has plural spacers in its non-display region. The spacers are formed by curing the curable resin composition for photo-patterning of the present invention, and the elastic deformation modulus "(elastic deformation quantity/total deformation quantity)×100" of the spacers is 60% or more against a compressive load of 2.0 GPa at room temperature.

The spacers disposed on liquid crystal panel substrate according to the present invention have such a sufficient hardness that the spacers are not easily plastically deformed against a compressive load at room temperature and flexibility that can follow thermal contraction and expansion of a liquid crystal display device within a use environment temperature range.

Accordingly, when the liquid crystal panel substrate according to the present invention is adhered to a partner substrate by a room-temperature cell pressure adhesion method, the load is made even over the whole of the substrate by the relief or the absorption of pressure unevenness. Thus, the generation of gap unevenness is prevented. Moreover, after the release of the compressive load, the height of the cell is substantially completely restored to its original height, so that the cell gap can be kept at a given interval.

Even if the completed liquid crystal panel is temporarily distorted when external force such as impact or pressing force is applied to the panel, the cell gap is restored to the original state so that display unevenness can be prevented. Furthermore, the generation of foams in a liquid crystal layer can also be prevented since the liquid crystal panel can follow thermal contraction and expansion of the liquid crystal within a wide temperature range including room temperature.

The spacers of the liquid crystal panel substrate according to the present invention are very satisfactorily restored to the original state even if the spacers are deformed by a compressive load. Therefore, even if the display region of a liquid crystal display device is large or the cell gap thereof is very narrow, the liquid crystal panel substrate according to the present invention can keep the cell gap precise and even.

The spacers of the liquid crystal panel substrate according to the present invention exhibit an appropriate elastic deformation at room temperature. Accordingly, when the liquid crystal panel substrate according to the present invention is subjected to adhesion by a room-temperature cell pressure adhesion method, no plastic deformation is caused so that a precise and even cell gap can be formed. The column-shaped spacers of the liquid crystal panel substrate according to the present invention can be suitably used when room-temperature cell pressure adhesion is performed in the ODF technology.

In the liquid crystal panel according to the present invention, at least one of its display side substrate, such as a color filter, and its liquid crystal driving side substrate, such as a TFT substrate, is made of the liquid crystal panel substrate according to the present invention.

In the liquid crystal panel according to the present invention, the cell gap can be kept precise and even at the time of cell pressure adhesion and subsequent handling of the cell. For this reason, display unevenness is not easily generated and the display quality of the panel is superior.

EXAMPLES

The present invention will be described in more detail by the following Example A and B series. The combination use of the imide-containing copolymer (a) with the polyfunctional thiol compound (b) will particularly be descried in the Examples B series.

Example A Series

Example A1

(1) Synthesis of a Copolymer Resin Solution A1

Into a polymerizing tank were charged 80 parts by weight of 3,4,5,6-tetrahydrophthalimideethyl methacrylate (THPI-MA), 20 parts by weight of methacrylic acid (MAA), and 185 parts by weight of diethylene glycol dimethyl ether (DMDG), and the resultant was stirred to prepare a solution. Thereafter, 4 parts by weight of 2,2'-azobis(2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 10 parts by weight of glycidyl methacrylate (GMA), 0.5 part by weight of triethylamine, and 0.1 part by weight of hydroquinone. The solution was stirred at 100° C. for 5 hours to yield the target copolymer resin solution A1 (solid content: 35%).

(2) Preparation of a Curable Resin Composition A1

The following materials were mixed in the following amounts under stirring at room temperature to yield a curable resin composition A1.

<Composition of the Curable Resin Composition A1>

The above-mentioned copolymer resin solution A1 (solid content: 35%): 69.0 parts by weight, Dipentaerythritol pentaacrylate (SR399, made by Sertomer Co.): 11.0 parts by weight, Ortho-cresol novolak type epoxy resin (Epi Coat 180S70, made by Japan Epoxy Resin): 15.0 parts by weight, 2-methyl-1-(4-methylthiophenyl)-2-morpholinopropanone -1: 1.5 parts by weight, 2,2'-bis(o-chlorophenyl)-4,5,4',5'-tetraphenyl-1,2'-bisimidazole: 1.0 part by weight Diethylene glycol dimethyl ether: 66.0 parts by weight

Example A2

(1) Synthesis of a Copolymer Resin Solution A2

Into a polymerizing tank were charged 80 parts by weight of THPI-MA, 15 parts by weight of MAA, and 5 parts by weight of 2-hydroxyethyl methacrylate (HEMA), 185 parts by weight of DMDG, and the resultant was stirred to prepare a solution. Thereafter, 4 parts by weight of 2,2'-azobis(2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 10 parts by weight of GMA, 0.5 part by weight of triethylamine, and 0.1 part by weight of hydroquinone. The solution was stirred at 100° C. for 5 hours to yield the target copolymer resin solution A2 (solid content: 38%).

(2) Preparation of a Curable Resin Composition A2

A curable resin composition A2 was yielded in the same way as in Example A1 except that the used resin was changed to the copolymer resin solution A2.

Example A3

(1) Synthesis of a Copolymer Resin Solution A3

Into a polymerizing tank were charged 80 parts by weight of THPI-MA, 10 parts by weight of MAA, 10 parts by weight of HEMA and 185 parts by weight of DMDG, and the resultant was stirred to prepare a solution. Thereafter, 4 parts by weight of 2,2'-azobis(2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 10 parts by weight of methacryloyloxyethylisocyante (MOI), 0.1 part by weight of dibutyltin laurate, and 0.1 part by weight of hydroquinone. The solution was stirred at 60° C. for 3 hours to yield the target copolymer resin solution A3 (solid content: 38%).

(2) Preparation of a Curable Resin Composition A3.

A curable resin composition A3 was yielded in the same way as in Example A1 except that the used resin was changed to the copolymer resin solution A3.

Comparative Example A1

(1) Synthesis of a Copolymer Resin Solution C-A1

Into a polymerizing tank were charged 80 parts by weight of THPI-MA, 20 parts by weight of MAA, and 185 parts by weight of DMDG, and the resultant was stirred to prepare a solution. Thereafter, 4 parts by weight of 2,2'-azobis(2-methylbutyronitrile) were added thereto and homogeneously dissolved therein. Thereafter, under nitrogen gas flow, the solution was stirred at 85° C. for 2 hours, and then reacted at 100° C. for 1 hour to yield the target copolymer resin solution C-A1 (solid content: 35%).

(2) Preparation of a Curable Resin Composition C-A1

A curable resin composition C-A1 was yielded in the same way as in Example A1 except that the used resin was changed to the copolymer resin solution C-A1.

Example A4

(1) Synthesis of a Copolymer Resin Solution A4

Into a polymerizing tank were charged 75 parts by weight of tetrahydrophthalimide acrylate (THPI-A), 25 parts by weight of acrylic acid (AA), and 185 parts by weight of diethylene glycol dimethyl ether (DMDG), and the resultant was stirred to prepare a solution. Thereafter, 4 parts by weight of 2,2'-azobis (2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 15 parts by weight of glycidyl methacrylate (GMA), 0.8 part by weight of triethylamine and 0.2 part by weight of hydroquinone. The solution was stirred at 100° C. for 5 hours to yield the target copolymer resin solution A4 (solid content: 39%). Physical properties of the resultant copolymer are shown in Table 1.

(2) Preparation of a Curable Resin Composition A4

The following materials were mixed in the following amounts under stirring at room temperature to yield a curable resin composition A4.

<Composition of the Curable Resin Composition A4>

The above-mentioned copolymer resin solution A4 (solid content: 39%): 41 parts by weight, Dipentaerythritol pentaacrylate (SR399, made by Sertomer Co.): 16 parts by weight, Ortho-cresol novolak type epoxy resin(Epi Coat 180S70, made by Japan Epoxy Resin): 4 parts by weight, 2-methyl-1-(4-methylthiophenyl)-2-morpholinopropane-1-on: 4 parts by weight
Diethylene glycol dimethyl ether: 35 parts by weight Example A5

(Preparation of a Curable Resin Composition A5)
The following materials were mixed in the following amounts under stirring at room temperature to yield a curable resin composition A5.
<Composition of the Curable Resin Composition A5>
The above-mentioned copolymer resin solution A4 (solid content: 39%): 10 parts by weight,
Dipentaerythritol pentaacrylate (SR399, made by Sertomer Co.): 28 parts by weight,
Ortho-cresol novolak type epoxy resin(Epi Coat 180S70, made by Japan Epoxy Resin): 4 parts by weight,
2-methyl-1-(4-methylthiophenyl)-2-morpholinopropane-1-on: 4 parts by weight
Diethylene glycol dimethyl ether: 54 parts by weight Comparative Example A2

(1) Synthesis of a Copolymer Resin Solution C-A2
Into a polymerizing tank were charged 75 parts by weight of methyl methacrylate (MMA), 25 parts by weight of acrylic acid (AA), and 185 parts by weight of diethylene glycol dimethyl ether (DMDG), and the resultant was stirred to prepare a solution. Thereafter, 4 parts by weight of 2,2'-azobis (2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 15 parts by weight of glycidyl methacrylate (GMA), 0.8 part by weight of triethylamine and 0.2 part by weight of hydroquinone. The solution was stirred at 100° C. for 5 hours to yield the target copolymer resin solution C-A2 (solid content: 39%). Physical properties of the resultant copolymer are shown in Table 1.
(2) Preparation of a Curable Resin Composition C-A2
A curable resin composition C-A2 was yielded in the same way as in Example A4 except that the used resin was changed to the copolymer resin solution C-A2.

<Composition of the Black Pigment Dispersed Solution>
Black pigment: 23 parts by weight,
High molecular dispersing agent (Disperbyk 111, made by BYK-Chemie Japan): 2 parts by weight,
Solvent (diethylene glycol dimethyl ether): 75 parts by weight.
The following components were sufficiently mixed in the following amounts, to yield a composition for a shading layer.

<Composition for the Shading Layer>
The above-mentioned black pigment dispersed solution: 61 parts by weight,
The curable resin composition of Example A1: 20 parts by weight,
Diethylene glycol dimethyl ether : 30 parts by weight.
The composition for shading layer was applied onto a glass substrate (AL material, made by Asahi Glass Company) having a thickness of 1.1 mm with a spin coater, and dried at 100° C. for 3 minutes to form a shading layer having a thickness of about 1 μm. The shading layer was exposed into a shading pattern to light from a superhigh pressure mercury lamp, and then developed with a 0.05% potassium hydroxide aqueous solution. Thereafter, the substrate was allowed to stand still in an atmosphere of 180° C. for 30 minutes, so as to conduct a heat treatment. In this way, a black matrix was formed in a region where a shading portion was to be formed.

(2) Formation of a Colored Layer
A red curable resin composition having the following composition was applied onto the substrate on which the black matrix was formed as described above by spin coating, to have a coating thickness of 1.5 μm, and subsequently the composition was dried in an oven of 70° C. for 30 minutes.
Next, a photo mask was positioned at a distance of 100 μm from the coating layer made of the red curable resin composition, and then only a region corresponding to a region where a color layer was to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the red curable resin composition were removed. Thereafter, the substrate was allowed to stand

TABLE 1

| | THPI-MA | MAA | AA | HEMA | GMA | MOI | Acid value (mgKOH/g) | $M_W$ (×10$^4$) | Concentration (%) |
|---|---|---|---|---|---|---|---|---|---|
| Example A1 | 80 | 20 | 0 | 0 | 10 | 0 | 86 | 2.3 | 35 |
| Example A2 | 80 | 15 | 0 | 5 | 10 | 0 | 57 | 2.5 | 38 |
| Example A3 | 80 | 10 | 0 | 10 | 0 | 10 | 62 | 2.3 | 38 |
| Example A4 | 75 | 0 | 25 | 0 | 15 | 0 | 119 | 1.5 | 39 |
| Comparative Example A1 | 80 | 20 | 0 | 0 | 0 | 0 | 136 | 2.0 | 35 |
| Comparative Example A2 | 0 | 75 | 25 | 0 | 15 | 0 | 119 | 1.5 | 39 |

Example A6

(1) Formation of a Black Matrix
The following components were mixed in the following amounts, and sufficiently dispersed in a sand mill, to prepare a black pigment dispersed solution.

still in an atmosphere of 180° C. for 30 minutes to conduct a heat treatment, thereby forming a red relief pattern in a region where red pixels were to be formed.
Next, a green curable resin composition having the following composition was used to form a green relief pattern in a region where green pixels were to be formed in the same processes for forming the red relief pattern.

Furthermore, a blue curable resin composition having the following composition was used to form a blue relief pattern in a region where blue pixels were to be formed in the same processes for forming the red relief pattern, so as to form a color layer composed of the three colors of red (R), green (G) and blue (blue).

<Red Curable Resin Composition>
C.I. Pigment Red 177: 10 parts by weight,
Polysulfonic acid type high molecular dispersing agent: 3 parts by weight,
The curable resin composition of Example A1: 5 parts by weight,
3-methoxylbutyl acetate: 82 parts by weight.
<Green Curable Resin Composition>
C.I. Pigment Green 36: 10 parts by weight,
Polysulfonic acid type high molecular dispersing agent: 3 parts by weight,
The curable resin composition of Example A1: 5 parts by weight,
3-methoxylbutyl acetate: 82 parts by weight.
<Blue Curable Resin Composition>
C.I. Pigment Blue 15:6: 10 parts by weight,
Polysulfonic acid type high molecular dispersing agent: 3 parts by weight,
The curable resin composition of Example A1: 5 parts by weight,
3-methoxylbutyl acetate: 82 parts by weight.

Example A7

A black matrix and a color layer were formed in the same way as in Example A6 except that the curable resin composition was changed to the curable resin composition A4 obtained in Example A4.

Example A8

(Formation of a Protect Layer)

The curable resin composition A1 of Example A1 was applied onto the glass substrate on which the color layer was formed in Example A6 by spin coating, and was dried to form a coating layer having a dry layer thickness of 2 μm.

Next, a photo mask was positioned at a distance of 100 μm from the coating layer made of the curable resin composition 1, and then only a region corresponding to a region where a color layer was to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the curable resin composition were removed. Thereafter, the substrate was allowed to stand still in an atmosphere of 200° C. for 30 minutes to conduct a heat treatment, thereby forming a protect layer. In this way, a color filter of the present invention was yielded.

Example A9

(Formation of a Protect Layer)

A protect layer was formed in the same way as in Example A8 except that the glass substrate was changed to the glass substrate where the color layer was formed in Example A7 and the curable resin composition was changed to the curable resin composition A4 obtained in Example A4.

Example A10

(Formation of a Spacer)

The curable resin composition A1 obtained in Example A1 was applied onto the glass substrate on which the color layer was formed in Example A6 by spin coating, and was dried to form a coating layer having a dry layer thickness of 5 μm.

A photo mask was positioned at a distance of 100 μm from the coating layer made of the curable resin composition A1, and then only a region, on the black matrix, where spacers were to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the curable resin composition were removed. Thereafter, the substrate was allowed to stand still in an atmosphere of 200° C. for 30 minutes to conduct a heat treatment, thereby forming fixed spacers. In this way, a color filter of the present invention was yielded.

Example A11

(Formation of Spacers)

Fixed spacers having an upper end area of 100 μm$^2$ and a thickness T of 4.5 μm were formed in the same way as in Example A10 except that the glass substrate was changed to the glass substrate on which the protect layer was formed in Example A9 and the curable resin composition was changed to the curable resin composition A4 obtained in Example A4. In this way, a color filter of the present invention was yielded.

Example A12

(Production of a Liquid Crystal Display Device)

A transparent electrode layer was formed on the surface including the fixed spacers of the color filter obtained in Example A10 by DC magnetron sputtering at a substrate temperature of 200° C. using argon and oxygen as electric discharge gases and using ITO as a target material. Thereafter, an oriented layer made of polyimide was formed on the transparent electrode layer.

Next, the above-mentioned color filter and the glass substrate on which TFTs were formed was jointed to each other with an epoxy resin as a sealing agent at a temperature of 150° C. and a pressure of 0.3 kg/cm$^2$, so as to fabricate a cell. A TN liquid crystal was filled into a gap of the cell, to produce a liquid crystal display device of the present invention.

Example A13

(Production of a Liquid Crystal Display Device)

A transparent electrode layer was formed on the surface including the fixed spacers of the color filter obtained in Example A11 by DC magnetron sputtering at a substrate temperature of 200° C. using argon and oxygen as electric discharge gases and using ITO as a target material. Thereafter, an oriented layer made of polyimide was formed on the transparent electrode layer.

Next, a necessary amount of a TN liquid crystal was dropped onto a glass substrate on which TFTs were formed, and the color filter was overlapped thereon. They were jointed to each other with a UV curable resin as a sealing agent by exposing them to light at a radiation amount of 400 mJ/cm$^2$ while applying a pressure of 0.3 kg/cm$^2$ thereto at room temperature, so as to fabricate a cell. In this way, a liquid crystal display device of the present invention was produced.

Example A14

(Production of a Color Filter)

A transparent electrode layer was formed on the color layer of the glass substrate on which the color layer was formed in Example A6, or the protect layer of the color filter on which the color layer and the protect layer were formed in Example A8 by DC magnetron sputtering at a substrate temperature of 200° C. using argon and oxygen as electric discharge gases and using ITO as a target material. Thereafter, an oriented layer made of polyimide was formed on the transparent electrode layer, to yield a color filter.

Example A15

(Production of a Color Filter)

Fixed spacers were formed on the substrate on which the protect layer was formed in Example A9 in the same way as in Example A11 except that the curable resin composition A5 obtained in Example A5 was used instead of the curable resin composition A4 in the same amount. In other words, the curable resin composition A4 was used for forming the black matrix, the color layer in the respective colors of R, G and B, and the protect layer, and the curable resin composition A5 was used only for forming fixed spacers, to produce a color filter in the same way as in Example A14.

Example A16

(Production of a Liquid Crystal Display Device)

The color filter obtained in Example A15 was used, and formation of an oriented layer and fabrication of a cell were carried out in the same way as in Example A13. In this way, a liquid crystal display device of the present invention was produced.

Comparative Example A3

Fixed spacers were formed on the substrate on which the protect layer was formed in Example A9 in the same way as in Example A11 except that the curable resin composition C-A2 obtained in Comparative Example A2 was used instead of the curable resin composition A4 in the same amount. In other words, the curable resin composition A4 was used for forming the black matrix, the color layer in the respective colors of R, G and B, and the protect layer, and the curable resin composition C-A2 was used only for forming fixed spacers.

Comparative Example A4

The color filter obtained in Comparative Example A3 was used, and formation of an oriented layer and fabrication of a cell were carried out in the same way as in Example A13. In this way, a liquid crystal display device as a Comparative Example was produced.

(Evaluation of Sensitivity)

The curable resin composition A1 obtained in Example A1 was applied onto a 10 cm square glass substrate with a spin coater (model: 1H-DX2, made by MIKASA) and dried to form a coating layer having a dry layer thickness of 2 µm. This coating layer was heated on a hot plate at 90° C. for 3 minutes. After the heating, a photo mask was positioned at a distance of 100 µm from the coating layer, and regions obtained by dividing the coating layer equally into 4 pieces were irradiated with ultraviolet rays at intensities of 25, 35, 50 and 100 mJ/cm2 (in terms of 405 nm luminous intensity), respectively, by means of a UV aligner (model: MA 1200, made by Dainippon Screen Mgf, Co., Ltd.) to which a 2.0 kW superhigh pressure mercury lamp was set.

After the irradiation with ultraviolet rays, each of the four regions was cut into a rectangular coating layer having a size of about 1 mm×3 mm, so as to make the glass substrate partially naked. The layer thickness of each of the irradiated regions was measured with a pin-sensing type surface roughness meter (Dektak 1600, made by Japan Anelva), and the layer thickness was referred to as layer thickness before development.

Next, a 0.05 wt % potassium hydroxide aqueous solution was sprayed onto the exposed portion of the coating layer for 60 minutes by means of a spin developing machine (model: 915, Applied Process Technology Inc.), and then the non-exposed portion was dissolved and removed. The remaining exposed portion was washed with pure water for 60 seconds, to perform development. After the development, the layer in the exposed portion was heated at 200° C. in a clean oven (SCOV-250 Hy-So, made by Oshitari Laboratory Inc.) for 30 minutes. The layer thickness of each of the regions of the resultant layer was measured by the same method as described above, and was referred to as the final layer thickness after curing.

From the thus-measured thickness before development and final thickness after curing, the residual layer rate was calculated according to the following equation:

Residual layer rate (%)=(final thickness after curing)/(layer thickness before development (µm))×100

On the other hand, the reference residual layer rate was decided as follows. First, the completely exposed layer thickness of the curable resin composition 1 was measured by the same method as used for the sample except that the entire surface of the coating layer was exposed to light at an intensity of 100 mJ/cm$^2$. Next, the coating layer exposed at 100 mJ/cm$^2$ was merely heated by the same method as used for the sample without being developed, and subsequently the layer thickness of the resultant layer was measured by the same method as described above. This layer thickness was referred to as the final layer thickness without the developing process. From the completely exposed layer thickness and the final layer thickness without the developing process that were measured as described above, the reference residual layer rate was calculated according to the following equation:

Reference residual layer rate (%)=(final layer thickness without the developing process (µm)÷(completely exposed layer thickness (µm))×100.

The smallest exposure amount in case where the thus-calculated residual layer rate was equal to the reference residual layer rate provided that the error limit was 1% was defined as the minimum exposure amount of the photo-curable resin composition A1.

By the above-mentioned method as described above, the coating layers of the curable resin compositions A2, A3 and C-A1 were formed, and the layer thickness before development, the final layer thickness after curing, the completely exposed layer thickness and the final layer thickness without the developing process thereof were measured. The each minimum exposure amount of the curable resin compositions A2, A3 and C-A1 was decided. The results are shown in Table 2.

TABLE 2

| | | Minimum exposure amount for curing (mJ/cm$^2$) |
|---|---|---|
| Example A1 | Curable resin composition A1 | 50 |
| Example A2 | Curable resin composition A2 | 35 |
| Example A3 | Curable resin composition A3 | 50 |
| Comparative Example A1 | Curable resin composition C-A1 | 100 |

(Evaluation of Elastic Deformation Modulus)

Fischer Scope H-100 (made by Fischer Instrument Co., Ltd.), to which an indenter, wherein a plane having a size of 100 μm×100 μm was formed by polishing a Vickers indenter (in a quadrangular pyramid form), was fitted, was used to apply a load to the each fixed spacers of the color filters obtained in Examples A11, A15 and Comparative Example A3 in the thickness direction at room temperature up to 2 GPa at a rate of 22 MPa/second. After the maximum state (2 GPa) was kept for 5 seconds, the load was removed in the thickness direction at a rate of 22 MPa/second. The deformation quantity (μm) at this time was measured, and the total deformation quantity T1, the elastic deformation quantity T2 and the elastic deformation quantity T3 were calculated, and the elastic deformation modulus "(T3/T1)×100" was calculated. The results are shown in Table 3.

TABLE 3

| | | Elastic deformation Modulus (%) |
|---|---|---|
| Example A11 | Curable resin composition A4 (Example 4) | 81 |
| Example A15 | Curable resin composition A5 (Example 5) | 63 |
| Comparative Example A3 | Curable resin composition C-A2 (Comparative Example 2) | 58 |

(Liquid Crystal Display Evaluation)

The liquid crystal display devices obtained in Examples 13 and 16 and Comparative Example 4 were used to observe whether or not there was a color unevenness based on difference between the fixed spacers.

TABLE 4

| | | Color unevenness |
|---|---|---|
| Example A13 | Curable resin composition A4 (Example 4) | Not observed |
| Example A16 | Curable resin composition A5 (Example 5) | Not observed |
| Comparative Example A4 | Curable resin composition C-A2 (Comparative Example 2) | Observed |

Examples B Series

Example B1

(Synthesis of a Copolymer Resin Solution B1)

Into a polymerizing tank were charged 73 parts by weight of tetrahydrophthalimide methacrylate (THPI-MA), 18 parts by weight of methacrylic acid (MAA), and 185 parts by weight of diethylene glycol dimethyl ether (DMDG), and the resultant was stirred to prepare a solution. Thereafter, 4 parts by weight of 2,2'-azobis(2-methylbutyronitrile) were added thereto and homogeneously dissolved therein. Thereafter, under nitrogen gas flow, the solution was stirred at 85° C. for 2 hours, and then reacted at 100° C. for 1 hour. To the resultant solution were added 9 parts by weight of glycidyl methacrylate (GMA), 0.5 part by weight of triethylamine and 0.1 part by weight of hydroquinone. The solution was stirred at 100° C. for 5 hours to yield the target copolymer resin solution B1 (solid content: 35%).

Physical properties of the resultant copolymer are shown in Table 5.

TABLE 5

| | THPI-MA | MAA | GMA | Acid value (mgKOH/g) | M$_W$ (×10$^4$) | Concentration (%) |
|---|---|---|---|---|---|---|
| Example 1 | 73 | 18 | 9 | 86 | 2.3 | 35 |

(Preparation of a Curable Resin Composition B1)

The following materials were mixed in the following amounts under stirring at room temperature to yield a curable resin composition B1.

<Composition of the Curable Resin Composition B1>

The above-mentioned copolymer resin solution B1 (solid content: 35%): 69.0 parts by weight, Pentaerythritol tetrak is propionate (PETP, made by Yodo Kagaku Co., Ltd.): 1.5 parts by weight, Dipentaerythritol pentaacrylate (SR399, made by Sertomer Co.): 11.0 parts by weight, Ortho-cresol novolak type epoxy resin(Epi Coat 180S70, made by Japan Epoxy Resin): 15.0 parts by weight, 2-methyl-1-(4-methylthiophenyl)-2-morpholinopropan-1-on: 1.5 parts by weight, 2,2'-bis(o-chlorophenyl)-4,5,4',5'-tetraphenyl-1,2'-bisimidazole: 1.0 part by weight, Diethylene glycol dimethyl ether: 66.0 parts by weight.

Example B2

Preparation of a Curable Resin Composition B2

The following materials were mixed in the following amounts under stirring at room temperature to yield a curable resin composition B2.

<Composition of the Curable Resin Composition B2>

The above-mentioned copolymer resin solution B1 (solid content: 35%): 69.0 parts by weight, Isocyanuric acid type thiol (THEIC-BMPA, made by Yodo Kagaku Co., Ltd.): 1.5 parts by weight, Dipentaerythritol pentaacrylate (SR399, made by Sertomer Co.): 11.0 parts by weight, Ortho-cresol novolak type epoxy resin(Epi Coat 180S70, made by Japan Epoxy Resin): 15.0 parts by weight, 2-methyl-1-(4-methylthiophenyl)-2-morpholinopropan-1-on: 1.5 parts by weight, 2,2'-bis(o-chlorophenyl)-4,5,4',5'-tetraphenyl-1,2'-bisimidazole: 1.0 part by weight, Diethylene glycol dimethyl ether: 66.0 parts by weight.

Example C-B1

(Preparation of a Curable Resin Composition C-B1)

The following materials were mixed in the following amounts under stirring at room temperature to yield a curable resin composition C-B1.

<Composition of the Curable Resin Composition C-B1>

The above-mentioned copolymer resin solution B1 (solid content: 35%): 69.0 parts by weight, Dipentaerythritol pentaacrylate (SR399, made by Sertomer Co.): 11.0 parts by weight, Ortho-cresol novolak type epoxy resin (Epi Coat 180S70, made by Japan Epoxy Resin): 15.0 parts by weight, 2-methyl-1-(4-methylthiophenyl)-2-morpholinopropan-1-on: 1.5 parts by weight, 2,2'-bis(o-chlorophenyl)-4,5,4',5'-tetraphenyl-1,2'-bisimidazole: 1.0 part by weight, Diethylene glycol dimethyl ether: 66.0 parts by weight.

Example B3

(1) Formation of a Black Matrix

The following components were mixed in the following amounts, and sufficiently dispersed in a sand mill, to prepare a black pigment dispersed solution.

<Composition of the Black Pigment Dispersed Solution>

Black pigment: 23 parts by weight,

High molecular dispersing agent (Disperbyk 111, made by BYK-Chemie Japan): 2 parts by weight, Solvent (diethylene glycol dimethyl ether): 75 parts by weight.

The following components were sufficiently mixed in the following amounts, to yield a composition for a shading layer.

<Composition for the Shading Layer>

The above-mentioned black pigment dispersed solution: 61 parts by weight,

The curable resin composition of Example B1: 20 parts by weight,

Diethylene glycol dimethyl ether : 30 parts by weight.

The composition for shading layer was applied onto a glass substrate (AL material, made by Asahi Glass Company) having a thickness of 1.1 mm with a spin coater, and dried at 100° C. for 3 minutes to form a shading layer having a thickness of about 1 μm. The shading layer was exposed into a shading pattern to light from a superhigh pressure mercury lamp, and then developed with a 0.05% potassium hydroxide aqueous solution. Thereafter, the substrate was allowed to stand still in an atmosphere of 180° C. for 30 minutes, so as to conduct a heat treatment. In this way, a black matrix was formed in a region where a shading portion was to be formed.

(2) Formation of a Colored Layer

A red curable resin composition having the following composition was applied onto the substrate on which the black matrix was formed as described above by spin coating, to have a coating thickness of 1.5 μm, and subsequently the composition was dried in an oven of 70° C. for 30 minutes.

Next, a photo mask was positioned at a distance of 100 μm from the coating layer made of the red curable resin composition, and then only a region corresponding to a region where a color layer was to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the red curable resin composition were removed. Thereafter, the substrate was allowed to stand still in an atmosphere of 180° C. for 30 minutes to conduct a heat treatment, thereby forming a red relief pattern in a region where red pixels were to be formed.

Next, green curable resin composition having the following composition was used to form a green relief pattern in a region where green pixels were to be formed in the same processes for forming the red relief pattern.

Furthermore, a blue curable resin composition having the following composition was used to form a blue relief pattern in a region where blue pixels were to be formed in the same processes for forming the red relief pattern, so as to form a color layer composed of the three colors of red (R), green (G) and blue (blue)

<Red Curable Resin Composition>

C.I. Pigment Red 177: 10 parts by weight,

Polysulfonic acid type high molecular dispersing agent: 3 parts by weight,

The curable resin composition of Example B1: 5 parts by weight, 3-methoxylbutyl acetate: 82 parts by weight.

<Green Curable Resin Composition>

C.I. Pigment Green 36: 10 parts by weight,

Polysulfonic acid type high molecular dispersing agent: 3 parts by weight,

The curable resin composition of Example B1: 5 parts by weight, 3-methoxylbutyl acetate: 82 parts by weight.

<Blue Curable Resin Composition>

C.I. Pigment Blue 15:6: 10 parts by weight,

Polysulfonic acid type high molecular dispersing agent: 3 parts by weight,

The curable resin composition of Example B1: 5 parts by weight, 3-methoxylbutyl acetate: 82 parts by weight.

Example B4

(Formation of a Protect Layer)

The curable resin composition B1 of Example B1 was applied onto the glass substrate on which the color layer was formed in Example B3 by spin coating, and was dried to form a coating layer having a dry layer thickness of 2 μm.

Next, a photo mask was positioned at a distance of 100 μm from the coating layer made of the curable resin composition B1, and then only a region corresponding to a region where a color layer was to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the curable resin composition were removed. Thereafter, the substrate was allowed to stand still in an atmosphere of 200° C. for 30 minutes to conduct a heat treatment, thereby forming a protect layer. In this way, a color filter of the present invention was yielded.

Example B5

(Formation of a Spacer)

The curable resin composition B1 obtained in Example B1 was applied onto the glass substrate on which the color layer was formed in Example B3 by spin coating, and was dried to form a coating layer having a dry layer thickness of 5 μm.

A photo mask was positioned at a distance of 100 μm from the coating layer made of the curable resin composition B1, and then only a region, on the black matrix, where spacers were to be formed was irradiated with ultraviolet rays for 10 seconds, using a 2.0 kW superhigh pressure mercury lamp of a proximity aligner. Next, the substrate was immersed in a 0.05 wt % potassium hydroxide aqueous solution (solution temperature: 23° C.) for 1 minute to perform alkali-development. In this way, only uncurable portions of the coating layer made of the curable resin composition were removed. Thereafter, the substrate was allowed to stand still in an atmosphere of 200° C. for 30 minutes to conduct a heat treatment, thereby forming fixed spacers having an upper end area of 100 μm² and a thickness T of 4.5 μm. In this way, a color filter of the present invention was yielded.

Example B6

(Production of a Liquid Crystal Display Device)

A transparent electrode layer was formed on the surface including the fixed spacers of the color filter obtained in Example B5 by DC magnetron sputtering at a substrate temperature of 200° C. using argon and oxygen as electric discharge gases and using ITO as a target material. Thereafter, an oriented layer made of polyimide was formed on the transparent electrode layer.

Next, the above-mentioned color filter and the glass substrate on which TFTs were formed was jointed to each other with an epoxy resin as a sealing agent at a temperature of 150° C. and a pressure of 0.3 kg/cm², so as to fabricate a cell. A TN liquid crystal was filled into a gap of the cell, to produce a liquid crystal display device of the present invention.

Example B7

(Production of a Color Filter)

A transparent electrode layer was formed on the color layer of the glass substrate on which the color layer was formed in Example B3, or the protect layer of the color filter on which the color layer and the protect layer were formed in Example B4 by DC magnetron sputtering at a substrate temperature of 200° C. using argon and oxygen as electric discharge gases and using ITO as a target material. Thereafter, an oriented layer made of polyimide was formed on the transparent electrode layer, to yield a color filter.

(Evaluation of Sensitivity)

The each minimum exposure amount of the curable resin compositions B1, B2 and C-B1 obtained in Examples B1, B2 and C-B1 was decided in the same manner as in the Example A series. The results are shown in Table 6.

TABLE 6

|  |  | Minimum exposure amount for curing (mJ/cm²) |
| --- | --- | --- |
| Example B1 | Curable resin composition B1 | 25 |
| Example B2 | Curable resin composition B2 | 25 |
| Example C-B1 | Curable resin composition C-B1 | 50 |

What is claimed is:

1. A curable resin for photo-patterning, which is an imide-containing copolymer having a molecular structure wherein at least the following units are connected: a constitutional unit having a cyclic imide group represented by the following formula (1):

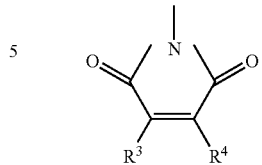

FORMULA (1)

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group other than the cyclic imide group, wherein the photopolymerizing functional group other than the cyclic imide group is an ethylenic unsaturated bond.

2. The curable resin for photo-patterning according to claim 1, wherein the imide-containing copolymer comprises, as the constitutional unit having the photopolymerizing functional group, a constitutional unit represented by the following formula (4) or a constitutional unit represented by the following (5):

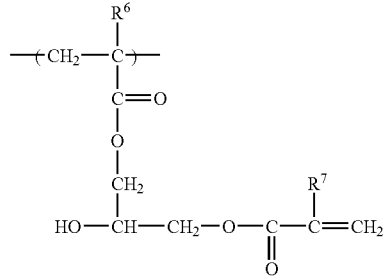

FORMULA (4)

wherein $R^6$ and $R^7$ each independently represent a hydrogen atom or a methyl group,

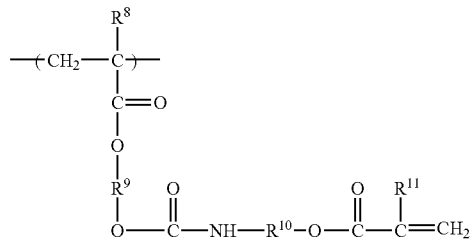

FORMULA (5)

wherein $R^8$ and $R^{11}$ each independently represent a hydrogen atom or a methyl group, $R^9$ represents an alkylene group having 2 to 4 carbon atoms, and $R^{10}$ represents an alkylene group.

3. The curable resin for photo-patterning according to claim 2, wherein the imide-containing copolymer contains 5 mol % to 45 mol % of the constitutional unit represented by the formula (4), or 1 mol % to 45 mol % of the constitutional unit represented by the formula (5).

4. The curable resin for photo-patterning according to claim 1, wherein the imide-containing copolymer comprises, as the constitutional unit having the cyclic imide group, a constitutional unit represented by the following formula (2) and comprises, as the constitutional unit having the acid functional group, a constitutional unit represented by the following formula (3):

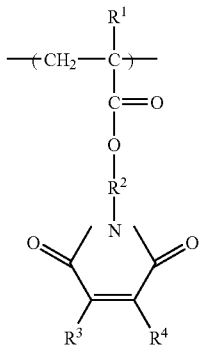
FORMULA (2)

wherein $R^1$ represents a hydrogen atom or a methyl group, $R^2$ represents an alkylene group having 1 to 6 carbon atoms, and $R^3$ and $R^4$ are the same as described above,

FORMULA (3)

wherein $R^5$ represents a hydrogen atom or a methyl group.

5. The curable resin for photo-patterning according to claim 1, wherein the imide-containing copolymer has, in the molecule thereof, an alcoholic hydroxyl group.

6. The curable resin for photo-patterning according to claim 1, wherein the imide-containing copolymer contains 10 mol % to 90 mol % of the constitutional unit having the cyclic imide group.

7. A curable resin composition for photo-patterning, comprising, as an essential component, the curable resin (a) for photo-patterning according to claim 1 which comprises an imide-containing copolymer having a molecular structure wherein at least the following units are connected: a constitutional unit having a cyclic imide group represented by the following formula (1):

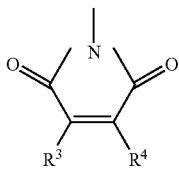
FORMULA (1)

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group other than the cyclic imide group, wherein the photopolymerizing functional group other than the cyclic imide group is an ethylenic unsaturated bond.

8. The curable resin composition for photo-patterning according to claim 7, wherein the elastic deformation modulus "(elastic deformation quantity/total deformation quantity)×100" of the composition is 60% or more against a compressive load of 2.0 GPa at room temperature after the composition is cured.

9. The curable resin composition for photo-patterning according to claim 7, which further comprises a compound (b) having 2 or more mercapto groups.

10. The curable resin composition for photo-patterning according to claim 9, wherein the compound (b) is a compound having 3 or more mercapto groups.

11. The curable resin composition for photo-patterning according to claim 9, which comprises, as solid contents, 5 to 80% by weight of the imide-containing copolymer (a) and 0.01 to 60% by weight of the compound (b).

12. The curable resin composition for photo-patterning according to claim 9, which further comprises a photopolymerizable compound (c) having 2 or more photopolymerizing functional groups.

13. The curable resin composition for photo-patterning according to claim 12, which comprises, as solid contents, 5 to 80% by weight of the imide-containing copolymer (a), 0.01 to 20% by weight of the compound (b), and 3 to 80% by weight of the photopolymerizable compound (c).

14. The curable resin composition for photo-patterning according to claim 7, which further comprises a photopolymerizable compound (c) having 2 or more photopolymerizing functional groups.

15. The curable resin composition for photo-patterning according to claim 14, wherein the photopolymerizable compound (c) comprises 3 or more ethylenic unsaturated bonds as the photopolymerizing functional groups, and comprises an alcoholic hydroxyl group.

16. The curable resin composition for photo-patterning according to claim 7, which further comprises a photopolymerization initiator.

17. The curable resin composition for photo-patterning according to claim 7, which is used to produce a color filter.

18. A color filter, which comprises a transparent substrate, and a color layer disposed on the transparent substrate, and may comprise a protect layer for covering the color layer and/or a spacer disposed in a non-display region of the substrate, wherein at least one of the color layer, the protect layer and the spacer is formed by curing the curable resin composition for photo-patterning which comprises an imide-containing copolymer having a molecular structure wherein at least the following units are connected: a constitutional unit having a cyclic imide group represented by the following formula (1):

FORMULA (1)

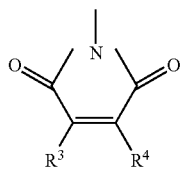

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group other than the cyclic imide group, wherein the photopolymerizing functional group other than the cyclic imide group is an ethylenic unsaturated bond.

19. The color filter according to claim 18, wherein the elastic deformation modulus "(elastic deformation quantity/total deformation quantity)×100" of the spacer is 60% or more against a compressive load of 2.0 GPa at room temperature.

20. A liquid crystal panel, wherein a display side substrate and a liquid crystal driving side substrate are faced with each other, a liquid crystal is put between the two, and the display side substrate is the color filter according to claim 18.

21. A liquid crystal panel substrate, wherein plural spacers are disposed in a non-display region on a substrate, the spacers are formed by curing the curable resin composition for photo-patterning which comprises an imide-containing copolymer having a molecular structure wherein at least the following units are connected: a constitutional unit having a cyclic imide group represented by the following formula (1):

FORMULA(1)

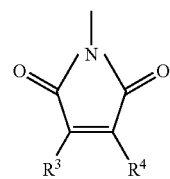

wherein $R^3$ and $R^4$ each independently represent an alkyl group having 4 or less carbon atoms, or one of $R^3$ and $R^4$ is a hydrogen atom and the other thereof is an alkyl group having 4 or less carbon atoms, or $R^3$ and $R^4$ are combined with each other to form a carbon ring; a constitutional unit having an acid functional group; and a constitutional unit having a photopolymerizing functional group other than the cyclic imide group, wherein the photopolymerizing functional group other than the cyclic imide group is an ethylenic unsaturated bond, and wherein the elastic deformation modulus "(elastic deformation quantity/total deformation quantity)×100" of the spacers is 60% or more against a compressive load of 2.0 GPa at room temperature.

22. A liquid crystal panel, wherein a display side substrate and a liquid crystal driving side substrate are faced with each other, a liquid crystal is put between the two, and the liquid crystal driving side substrate is the liquid crystal panel substrate according to claim 21.

* * * * *